(12) United States Patent
Takai et al.

(10) Patent No.: US 6,169,305 B1
(45) Date of Patent: Jan. 2, 2001

(54) SEMICONDUCTOR DEVICE AND METHOD FOR FABRICATING THE SAME

(75) Inventors: Kazuaki Takai; Kazuaki Kondo, both of Kawasaki (JP)

(73) Assignee: Fujitsu Limited, Kawasaki (JP)

( * ) Notice: Under 35 U.S.C. 154(b), the term of this patent shall be extended for 0 days.

(21) Appl. No.: 09/348,474

(22) Filed: Jul. 7, 1999

(30) Foreign Application Priority Data

Jul. 16, 1998 (JP) .................................................. 10-202100
Mar. 18, 1999 (JP) .................................................. 11-073501

(51) Int. Cl.[7] .......................... H01L 27/108; H01L 29/76; H01L 29/94; H01L 31/119
(52) U.S. Cl. ........................ 257/306; 438/239; 438/253; 438/396; 438/381; 257/295; 257/296; 257/310
(58) Field of Search ................................ 438/3, 240, 396, 438/238, 239, 253, 387, 250, 393, 210, 381, 650; 257/306, 310, 295, 296

(56) References Cited

U.S. PATENT DOCUMENTS 5,905,278 * 5/1999 Nakabayashi .......................... 257/296
5,976,928 * 5/1999 Kirlin et al. .......................... 438/240

* cited by examiner

*Primary Examiner*—Charles Bowers
*Assistant Examiner*—Hsien-Ming Lee
(74) *Attorney, Agent, or Firm*—Armstrong, Westerman, Hattori, McLeland & Naughton

(57) ABSTRACT

The semiconductor device comprises an electrode 36 including a first conductive film 30 formed of an oxide film of a first metal, a second conductive film 32 formed on the first conductive film 30 and formed of the first metal, and a third conductive film 34 formed on the second conductive film 32 and containing a second metal different form the first metal. The second conductive film is sandwiched between the first conductive film and the third conductive film, whereby adhesion of the third conductive film can be improved, and the release of the third conductive film can be prevented.

14 Claims, 26 Drawing Sheets

SEMICONDUCTOR DEVICE AND METHOD FOR FABRICATING THE SAME

BACKGROUND OF THE INVENTION

The present invention relates to a semiconductor device, more specifically to a semiconductor device including a capacitor.

FeRAM (Ferro-electric Random Access Memory) is nonvolatile semiconductor memory using ferro-electric as the capacitors. FeRAM is much noted because of its high speed, low electric power consumption and repeatability characteristics.

In the process for forming a ferro-electric capacitor, oxygen annealing is performed for higher crystallization of the ferro-electronic film after the electrodes have been formed.

Accordingly, it is necessary that the electrodes of the ferro-electric capacitor are formed of a material which is free from oxidation by the oxygen annealing and lowering the conductivity or does not deprive oxygen of the ferro-electric film to lower electric characteristics of the capacitor. Al, Ti, W, etc. which are widely used as electrode materials in the general semiconductor devices, are oxidized by the oxygen annealing or deprive oxygen of the ferro-electric film, and are not suitable for the electrodes of the ferro-electric capacitor.

Then, it is proposed to use Pt, which is not oxidized by the annealing in an oxygen atmosphere, as an electrode material of the ferro-electric capacitor.

However, in a case that the electrodes of the ferro-electric capacitor are formed of Pt, when an electric field is repeatedly applied to the ferro-electric film, a remanence value lowers as times of the application of the electric field increase, and good fatigue characteristics cannot be obtained.

Then, it is proposed that the electrodes of the ferroelectric capacitor are formed of a metal oxide, such as $IrO_2$, which is an electrode material providing good fatigue characteristics. Metal oxides, such as $IrO_2$, etc., neither decrease the conductivities due to oxidation by the oxygen annealing, nor deprive oxygen of the ferro-electric film to thereby degrade electric characteristics of the capacitor.

However, in a case that a lower electrode of the ferroelectric capacitor is formed of $IrO_2$ film, electric characteristics of the ferro-electric capacitor, such as spontaneous polarization, leakage current, etc., are degraded. This will be because the ferro-electric film formed on the lower electrode of such metal oxide, which is inferior to the usual metals in crystallization cannot have good crystallization. In a case that the upper electrode of the ferro-electric capacitor is formed of a metal oxide, such $IrO_2$ or others, at the contact of the upper electrode with a line of Al, TiN or others, the Al or TiN deprives oxygen of the upper electrode and is oxidized, and a contact resistance is increased.

Thus, in a case that the electrode material is a metal oxide, it is preferable that a metal which is not oxidized by the annealing in an oxygen atmosphere, is formed on the metal oxide. Then, the $Pt/IrO_2$ electrodes are proposed. By using the $Pt/IrO_2$ electrodes the capacitor can have good electric characteristics, and the increase of a contact resistance can be prevented. In addition, the ferro-electric film can have improved fatigue characteristics.

However, the $Pt/IrO_2$ stacked electrode has poor adhesion at the interface between the Pt film and the $IrO_2$ film, and the Pt film often releases from the $IrO_2$ film. This is an obstruction to improvement of fabrication yields of the FeRAMs.

SUMMARY OF THE INVENTION

An object of the present invention is to provide a semiconductor device including the electrodes of the capacitor which are stacked in good adhesion, and a process for fabrication of the semiconductor device.

The above-described object is achieved by a semiconductor device comprising: an electrode which includes a first conductive film formed of an oxide film of a first metal, a second conductive film formed on the first conductive film and formed of the first metal, and a third conductive film formed on the second conductive film and containing a second metal different from the first metal. The second conductive film is sandwiched between the first conductive film and the third conductive film, whereby adhesion of the third conductive film can be improved, and the release of the third conductive film can be prevented.

In the above-described semiconductor device it is preferable that the electrode further includes a fourth conductive film formed below the first conductive film and formed of the first metal. The fourth conductive film having good adhesion with the substrate is formed below the first conductive film, whereby adhesion of the first conductive film to the substrate can be improved, and accordingly adhesion of the substrate to the electrode can be improved.

The above-described object can be achieved by a semiconductor device comprising: a capacitor including a lower electrode, a dielectric film formed on the lower electrode and an upper electrode formed on the dielectric film; the lower electrode and/or the upper electrode being composed of the above-described electrode. The second conductive film is sandwiched between the first conducive film and the third conductive film, whereby adhesion of the third conductive can be improved, and accordingly release of the third conductive film can be prevented. The semiconductor device can have the electrodes of a capacitor having high adhesion.

The above-described object can be achieved by a semiconductor device comprising: an electrode including a first conducive film formed of an oxide film containing a first metal, a second conductive film formed on the first conductive film and formed of an oxide film containing a second metal different from the first metal, and a third conductive layer formed on the second conductive film and containing the second metal. The second conductive film has low film stress, whereby a number of particles sticking to the wafer can be depressed, and the semiconductor device can have improved fabrication yields.

In the above-described semiconductor device it is preferable that the second conductive film has an oxygen composition ratio which decreases gradually away from the interface thereof with the first conductive film. It can be suppressed that oxygen composition ratios are uninterrupted between the second conductive film and the third conductive film. The electrode can have good adhesion.

The above-described object is achieved by a semiconductor device comprising: a capacitor including a lower electrode, a dielectric film formed on the lower electrode and an upper electrode formed on the dielectric film, the lower electrode and/or the upper electrode being composed of the above-described electrode. The second conductive film has small film stress, whereby a number of particles sticking to the wafer can be suppressed, and accordingly the semiconductor device can have improved fabrication yields.

The above-described object is achieved by a process for fabricating a semiconductor device comprising the step of forming a first conductive film formed of an oxide film containing a first metal, the step of forming a second conductive film formed of an oxide film containing a second metal different from the first metal and having an oxygen composition ratio which decreases gradually away from the interface thereof with the first conductive film, and the step of forming a third conductive film formed on the second conductive film and containing the second metal, in the step of forming the second conductive film the second conductive film being formed with an oxygen concentration in a deposition chamber gradually decreased. The second conductive film having an oxygen composition ratio which decreases gradually away from the interface thereof with the first conductive film can be formed, whereby interrupted oxygen composition ratios between the second conductive film and the third conductive film can be depressed. Accordingly electrodes having good adhesion can be formed, and accordingly a semiconductor device having a capacitor of good adhesion can be fabricated.

BRIEF DESCRIPTION OF THE DRAWINGS

FIGS. 7A and 76 are sectional views of an example of an electrode structure of the semiconductor device according to the first embodiment (Part 2).

DETAILED DESCRIPTION OF THE INVENTION

[A First Embodiment]

Figure 1:
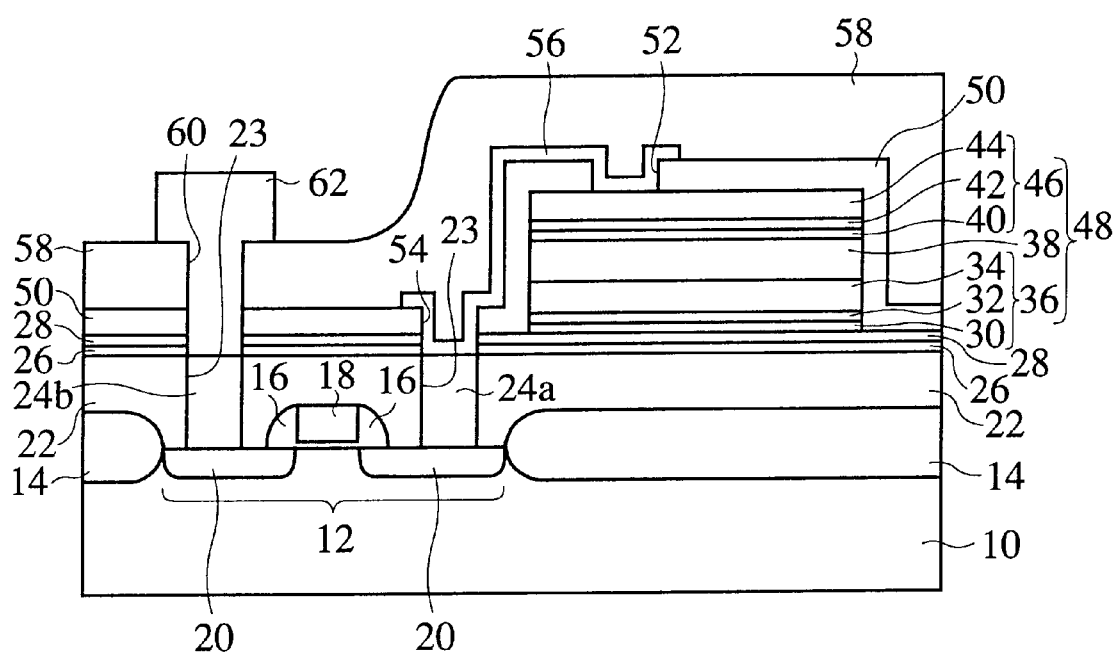
FIG. 1 is a sectional view of the semiconductor device according to a first embodiment of the present invention.

The semiconductor device according to a first embodiment of the present invention and the process for fabricating the same will be explained with reference to FIGS. 1 to 5. FIG. 1 is a sectional view of the semiconductor device according to the present embodiment. FIGS. 2A to 5 are sectional views of the semiconductor device according to the present embodiment in the steps of the process for fabricating the same, which show the process.

(Semiconductor Device)

The semiconductor device according to the present embodiment is applied to a ferro-electric RAM, i.e., an FeRAM.

As shown in FIG. 1, a device isolation film 14 is formed on a silicon substrate 10, defining a device region 12. In the device region 12 defined by the device isolation film 14 there is formed a transistor including a gate electrode 18 having a sidewall insulation film 16 formed on the side walls thereof, and a source/drain diffusion layer 20.

A 400 nm-thickness inter-layer insulation film 22 is formed on the entire surface. A contact hole 23 is formed in the inter-layer insulation film 22 down to the source/drain diffusion layer 20. Conductor plugs 24a, 24b are formed in the contact hole 23.

A stopper film 26 of an 100 nm-thickness silicon nitride film and a silicon oxide film 28 of an 100 nm-thickness silicon oxide film are formed sequentially on the inter-layer insulation film 22.

On the silicon oxide film 28, there is formed a lower electrode 36 of Pt/Ir/IrO$_2$ structure which is formed by sequentially depositing a 50 nm-thickness IrO$_2$ film 30, a 50 nm-thickness Ir film 32, and a 75 nm-thickness Pt film 34. A ferro-electric film 38 of an 300 nm-thickness PbZr$_x$Ti$_{1-x}$O$_3$ (PZT) film is formed on the lower electrode 36. A composition ratio X of Zr can be, e.g., 0.4, but is not essentially limited to 0.4 and can be suitably set.

On the ferro-electric film 38, there is formed an upper electrode 46 of Pt/Ir/IrO$_2$ structure which is formed by sequentially depositing a 50 nm-thickness IrO$_2$ film 40, a 50 nm-thickness Ir film 42, and a 75 nm-thickness Pt film 44. The lower electrode 36, the ferro-electric film 38 and the upper electrode 46 constitute a capacitor 48 of a memory.

The semiconductor device according to the present embodiment is characterized by the lower electrode 36 and the upper electrode 46. That is, in the lower electrode 36 the Pt film 34 is not formed directly on the IrO$_2$ film 30 but the Ir film 32 formed on the IrO$_2$ film 30 and the Pt film 34 formed on the Ir film 32. The electrode of such Pt/Ir/IrO$_2$ structure has improved adhesion between the Pt film 34 and the IrO$_2$ film 30 because of the Ir film 32 sandwiched between the IrO$_2$ film 30 and the Pt film 34, which is not an oxide film. Release of the Pt film 34 can be prevented. Similarly therewith, the upper electrode 46 as well has the Pt/Ir/IrO$_2$ structure, whereby the adhesion between the Pt film 44 and the IrO$_2$ film 40 can be improved, and the release of the Pt film 44 can be prevented.

A 200 nm-thickness silicon oxide film 50 is formed on the entire surface. In the silicon oxide film 50 there are formed a contact hole 52 down to the upper electrode 46 and a contact hole 54 down to the conductor plug 24a. A local line 56 interconnecting the upper electrode 46 and the conductor plug 24a through the contact holes 52, 54 is formed on the silicon oxide film 50.

An inter-layer insulation film 58 of a 300 nm-thickness silicon oxide film is formed on the entire surface. A contact hole 60 is formed in the inter-layer insulation film 58, the silicon oxide films 50, 28 and the stopper film 26 down to the conductor plug 24b. A bit line 62 is connected to the conductor plug 24b through the contact hole 60.

As described above, according to the present embodiment, the electrodes of the capacitor has Pt/Ir/IrO$_2$ structure, i.e., having Ir film sandwiched between Pt film and IrO$_2$ film, whereby adhesion between the Pt film and the IrO$_2$ film can be improved, and release of the Pt film can be prevented.

(Process for Fabricating the Semiconductor Device)

The process for fabricating the semiconductor device according to the present embodiment will be explained with reference to FIGS. 2A to 5.

Figure 2A:
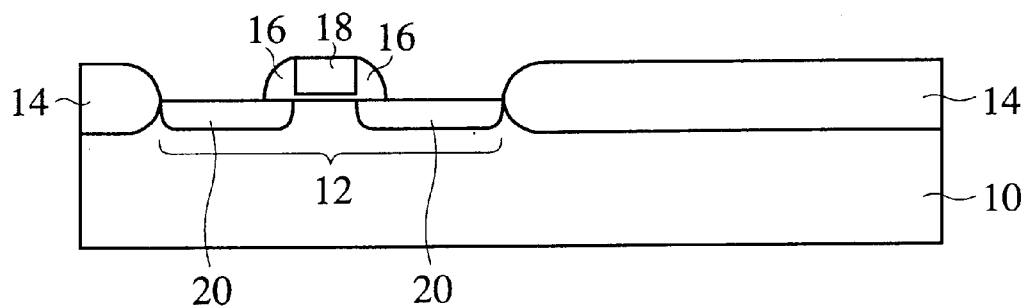
FIGS. 2A to 2C are sectional views of the semiconductor device according to the first embodiment in the steps of the process for fabricating the semiconductor device, which show the fabrication process (Part 1).

First, as shown in FIG. 2A, the device isolation film 14 for defining the device region 12 is formed on the surface of a silicon substrate 10 by LOCOS (LOCal Oxidation of Silicon).

Then, a transistor including the gate electrode 18 with the sidewall insulation film 16 formed on the side walls thereof, and the source/drain diffusion layer 20 is formed in the device region 12 (see FIG. 2A).

Then, the 400 nm-thickness inter-layer insulation film 22 of silicon oxide film is formed on the entire surface by CVD (Chemical Vapor Deposition), and then the surface of the inter-layer insulation film 22 is planarized by CMP (Chemical Mechanical Polishing).

Next, the contact hole 23 is formed in the inter-layer insulation film 22 down to the source/drain diffusion layer 20 by photolithography.

Then, a 20 nm-thickness Ti film and a 50 nm-thickness TiN film are sequentially formed on the entire surface by sputtering, and an adhesion layer of the Ti film and the TiN film is formed. Then, a 1 μm-thickness tungsten layer is formed on the entire surface by CVD.

Figure 2B:
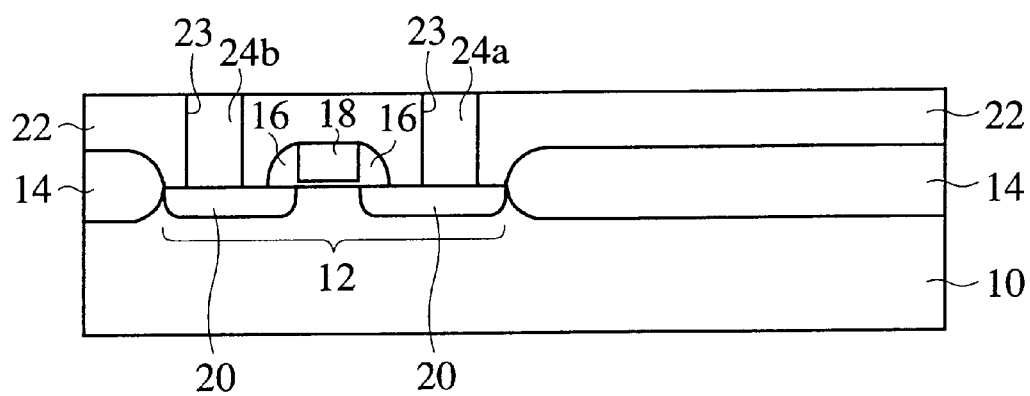

Next, the tungsten layer and the adhesion layer are polished by CMP until the surface of the inter-layer insulation film 22 is exposed, and the conductor plugs 24a, 24b of the adhesion layer and the tungsten layer are formed in the contact hole 23 (see FIG. 2B).

Figure 2C:
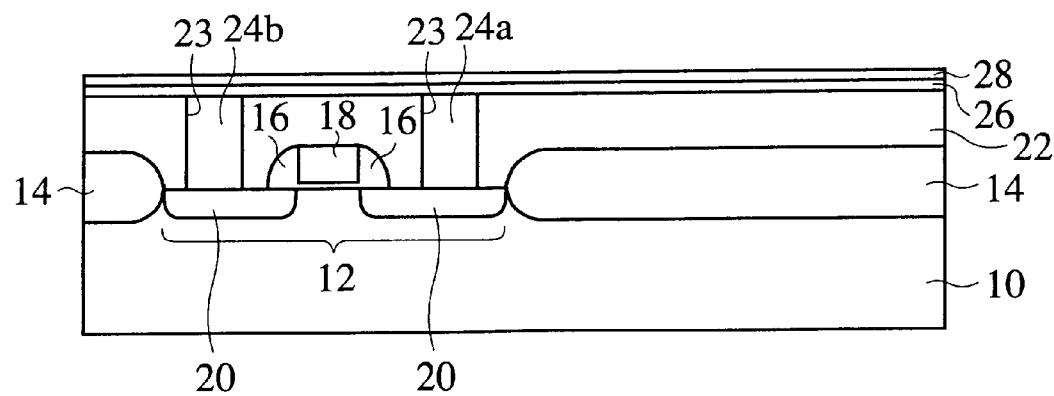

Then, the 100 nm-thickness silicon nitride film 26 and the 100 nm-thickness silicon oxide film 28 are sequentially formed on the entire surface by CVD (see FIG. 2C).

Next, the 50 nm-thickness IrO$_2$ film 30 is formed in an O$_2$ atmosphere by reactive sputtering. Conditions for forming the film can be, e.g., an Ir target, 0.5–5.0 kW power, a 50–200 sccm O$_2$ flow rate and a substrate temperature at a range from room temperature to 500° C.

Then, the 50 nm-thickness Ir film 32 is formed on the entire surface in an Ar atmosphere by sputtering. Conditions for forming the film can be, e.g., an Ir target, 0.5–5.0 kW power, a 50–200 sccm Ar flow rate and a substrate temperature at a range from room temperature to 500° C.

Next, the 75 nm-thickness Pt film is formed on the entire surface in an Ar atmosphere by sputtering. Conditions for forming the film can be, e.g., a Pt target, 0.5–5.0 kW power, a 50–200 sccm Ar flow rate and a substrate temperature at a range from room temperature to 500° C.

Figure 3A:
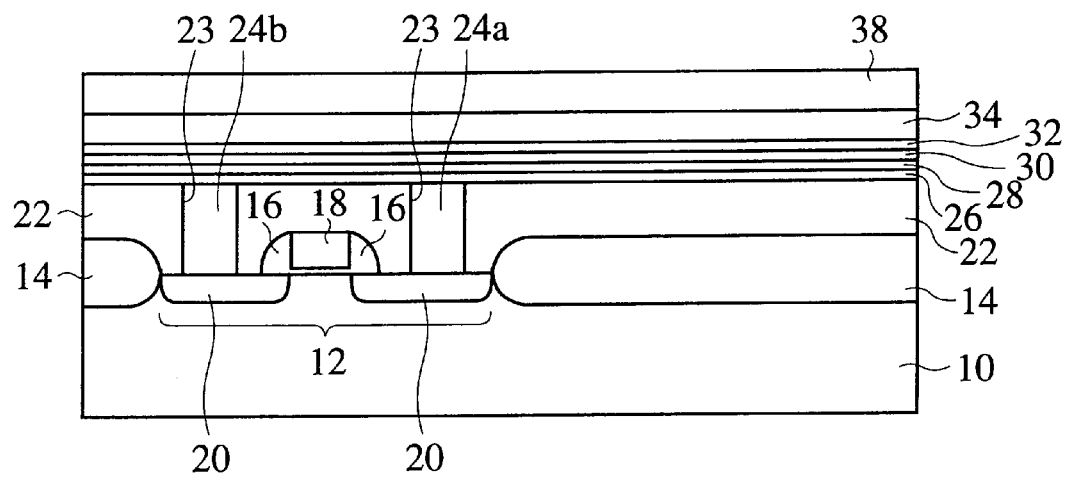
FIGS. 3A and 3B are sectional views of the semiconductor device according to the first embodiment in the steps of the process for fabricating the semiconductor device, which show the fabrication process (Part 2).

Then, a ferro-electric film 38 of a PbZr$_x$Ti$_{1-x}$O$_3$(PZT) film is formed on the entire surface by CVD (see FIG. 3A).

Next, in the same way as the IrO$_2$ film 30 is formed, a 50 nm-thickness IrO$_2$ film 40 is formed on the entire surface.

Then, in the same way as the Ir film 32 is formed, a 50 nm-thickness Ir film 42 is formed.

Figure 3B:
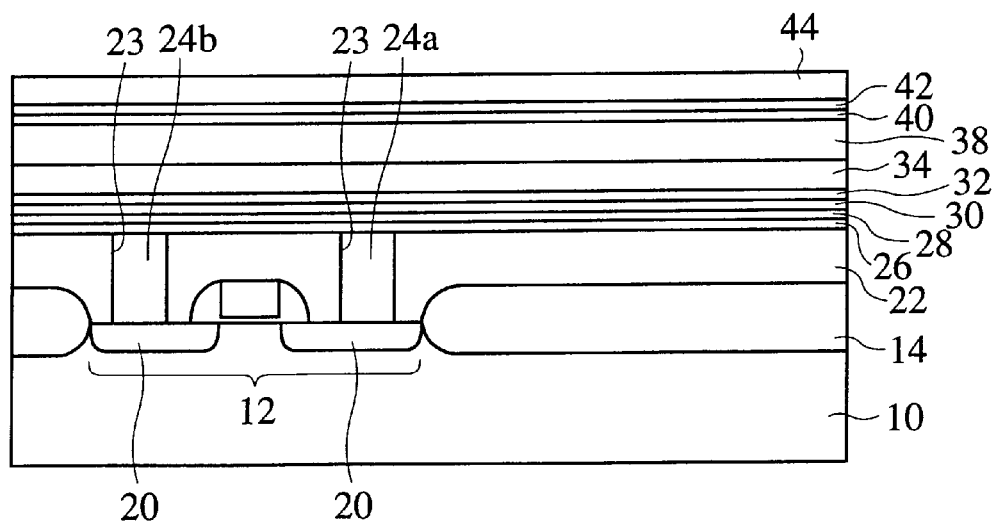

Then, in the same way as the Pt film 34 is formed, a 75 nm-thickness Pt film 44 is formed (see FIG. 3B).

Then, the Pt film 44, the Ir film 42, the IrO$_2$ film 40, the ferro-electric film 38, the Pt film 34, the Ir film 32 and the IrO$_2$ film 30 are patterned by photolithography, and the lower electrode 36 of Pt/Ir/IrO$_2$ structure is formed. The upper electrode 46 of Pt/Ir/IrO$_2$ structure is formed of the IrO$_2$ film 40, the Ir film 42 and the Pt film 44. The lower electrode 36, the ferro-electric film 38 and the upper electrode 46 constitute the capacitor 48 (see FIG. 4A). Dry etching may be used for the patterning. As an etching condition, etching gas may be, e.g., Cl$_2$ and Ar.

Then, a 200 nm-thickness silicon oxide film 50 is formed on the entire surface.

Next, the contact hole 52 is formed by photolithography in the silicon oxide film 50 down to the upper electrode 46. The contact hole 54 is formed in the silicon oxide films 50, 28 and the silicon nitride film 26 down to the conductor plug 24a.

Next, a TiN film is formed on the entire surface. The TiN film is patterned to form the local line 56 interconnecting the upper electrode 46 and the conductor plug 24a through the contact holes 52, 54 (see FIG. 4B).

Then, the inter-layer insulation film 58 of a 300 nm-thickness silicon oxide film is formed on the entire surface.

Next, the contact hole 60 is formed by photolithography in the inter-layer insulation film 58, the silicon oxide film 50, 28 and the silicon nitride film 26 down to the upper surface of the conductor plug 24b.

Then, a 600 nm-thickness Al film is formed on the entire surface. Then, the Al film is patterned to form the bit line 62 connected to the conductor plug 24b through the contact hole 60 (see FIG. 5).

Thus, the semiconductor device according to the present embodiment is fabricated.

The semiconductor device having the electrodes of the conventionally proposed Pt/IrO$_2$ structure has the release of the electrodes at the rate of, e.g., several sheets per 100 sheets of wafers. In contrast to this, the semiconductor device according to the present embodiment never has the release of the electrodes.

As described above, according to the present embodiment, the upper and the lower electrodes have the Pt/Ir/IrO$_2$ structure, i.e., having the Ir film sandwiched between the Pt film and the IrO$_2$ film, whereby the adhesion of the Pt film can be improved, and the release of the Pt film can be prevented.

In the present embodiment, the Pt/Ir/IrO$_2$ structure is applied to both the upper and the lower electrodes but may not be essentially applied to both the upper and the lower electrodes. The Pt/Ir/IrO$_2$ structure may be applied to, e.g., only either of the upper or the lower electrodes in which the release of the Pt film tends to take place.

In the present embodiment, the IrO$_2$ film being 50 nm, the Ir film being 50 nm, and Pt film being 75 nm, but thicknesses of the films are not limited to the stated thicknesses and may be suitably set.

Examples of the electrode structure of the capacitor will be explained with reference to FIGS. 6A to 7B. FIGS. 6A to 7B are sectional views of the examples of the electrode structure of the capacitor. In FIGS. 6A to 7B, the constituent members except the capacitor are omitted.

Figure 6A:
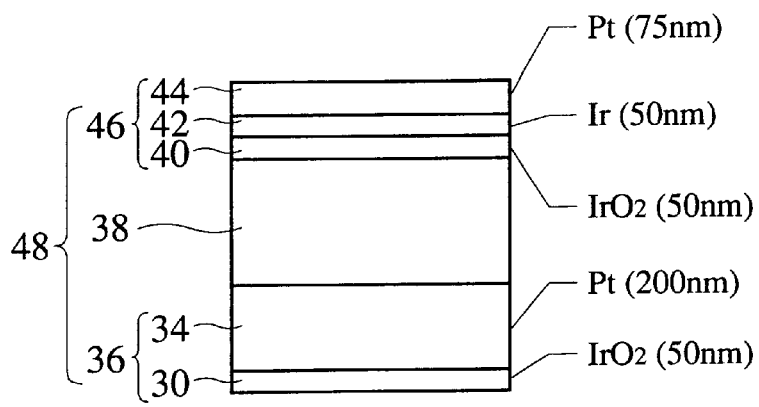
FIGS. 6A to 6C are sectional views of an example of an electrode structure of the semiconductor device according to the first embodiment (Part 1).

For example, in the capacitor shown in FIG. 6A, the IrO$_2$ film 30 of a 50 nm-thickness and the Pt film 34 of a 200 nm-thickness are sequentially formed to form the lower electrode 36 of Pt/IrO$_2$ structure, and the IrO$_2$ film 40 of a 50 nm thickness, the Ir film 42 of a 50 nm-thickness and the Pt film 44 of a 75 nm-thickness are sequentially formed to form the upper electrode 46 of Pt/Ir/IrO$_2$ structure. The ferro-electric film 38 is formed between the lower electrode 36 and the upper electrode 46, and the lower electrode 36, the ferro-electric film 38 and the upper a electrode 46 constitute the capacitor 48. That is, in the capacitor shown in FIG. 6A the Pt/Ir/IrO$_2$ structure is applied only to the upper electrode 46.

Figure 6B:
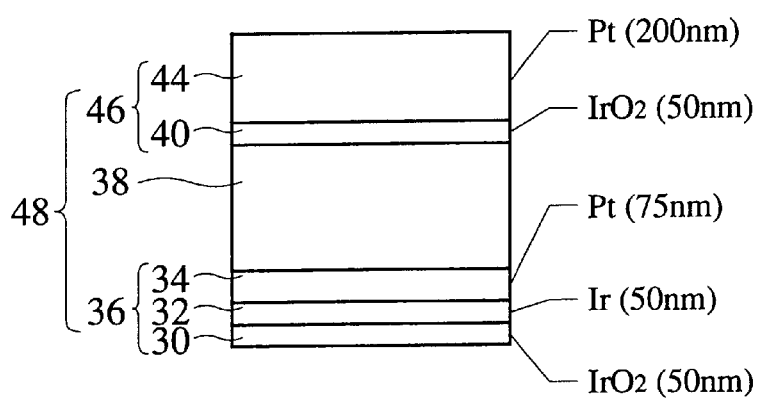

In the capacitor shown in FIG. 6B, the IrO$_2$ film 30 of a 50 nm-thickness, the Ir film 32 of a 50 nm-thickness and the Pt film 34 of a 75 nm-thickness are sequentially formed to form the lower electrode 36 of the Pt/Ir/IrO$_2$ structure, and the IrO$_2$ film 40 of a 50 nm-thickness and the Pt film 44 of a 200 nm-thickness are sequentially formed to form the upper electrode 46 of Pt/IrO$_2$ structure. The ferro-electric film 38 is formed between the lower electrode 36 and the upper electrode 48, and the lower electrode 36, the ferro-electric film 38 and the upper electrode 46 constitute the capacitor 48. That is, the Pt/Ir/IrO$_2$ structure is applied only to the lower electrode 36 of the capacitor shown in FIG. 6B.

Figure 6C:
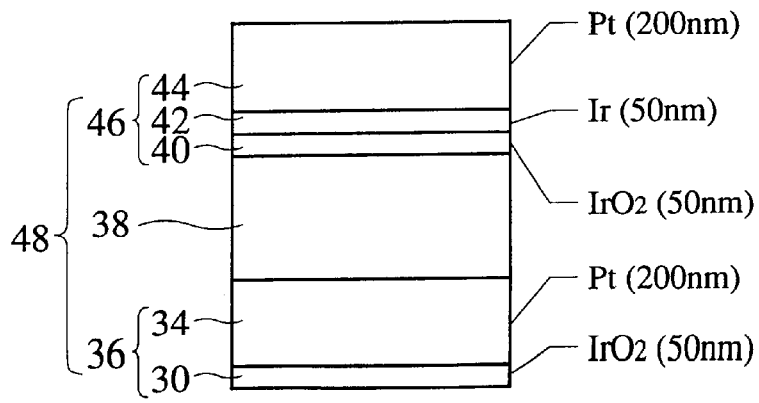

In the capacitor shown in FIG. 6C, the IrO$_2$ film 30 of a 50 nm-thickness and the Pt film 34 of a 200 nm-thickness are sequentially formed to form the lower electrode 36 of Pt/IrO$_2$ structure, and the IrO$_2$ film 40 of a 50 nm-thickness, the Ir film 42 of a 50 nm-thickness and the Pt film 44 of a 200 nm-thickness are sequentially formed to form the upper electrode 46 of Pt/Ir/IrO$_2$ structure. The ferro-electric film 38 is formed between the lower electrode 36 and the upper electrode 48. The lower electrode 36, the ferro-electric film 38 and the upper electrode 46 constitute the capacitor 48. That is, the capacitor shown in FIG. 6C has the Pt film 44 of the upper electrode 46 of a 200 nm-thickness which is thicker than that of the capacitor shown in FIG. 6A. The Pt film is made thicker, whereby the upper electrode 46 can have a larger sectional area, and accordingly can have a smaller resistance value.

Figure 7A:
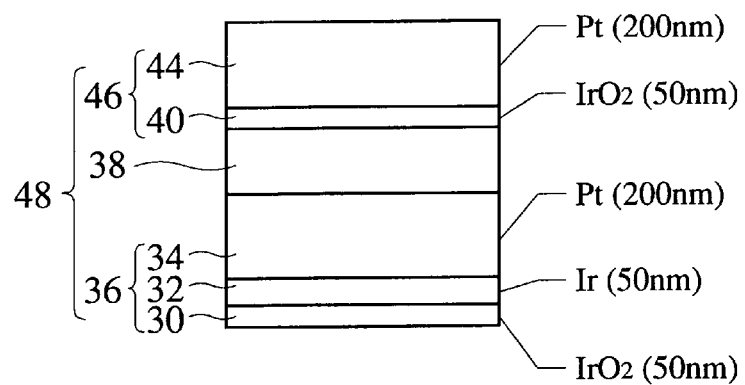

In the capacitor shown in FIG. 7A the IrO$_2$ film 30 of a 50 nm-thickness, the Ir film 32 of a 50 nm-thickness and the Pt film 34 of a 200 nm-thickness are formed to form the lower electrode 36 of Pt/Ir/IrO$_2$ structure, and the IrO$_2$ film 40 of a 50 nm-thickness and the Pt film 44 of a 200 nm-thickness are sequentially formed to form the upper electrode 46 of Pt/IrO$_2$ structure. The ferro-electric film 38 is formed between the lower electrode 36 and the upper electrode 48. The lower electrode 36, the ferro-electric film 38 and the upper electrode 46 constitute the capacitor 48. That is, the capacitor shown in FIG. 7A has the Pt film 34 of the lower electrode 36 of a 200 nm-thickness which is made thicker than that of the capacitor shown in FIG. 6B, whereby the lower electrode 36 can have a larger sectional area, and accordingly can have a smaller resistance value.

Figure 7B:
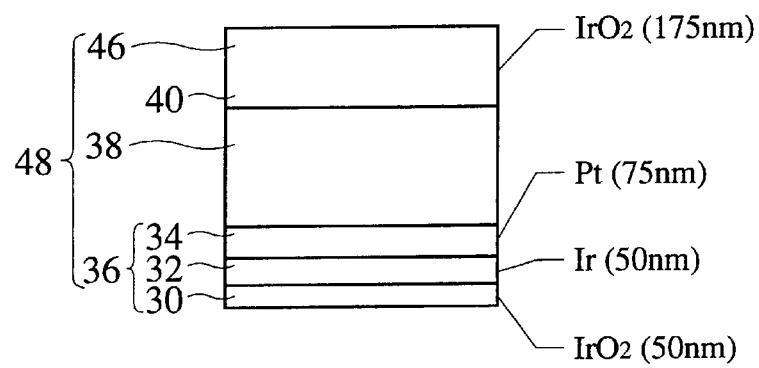

In the capacitor shown in FIG. 7B, the IrO$_2$ film 30 of a 50 nm-thickness, the Ir film 32 of a 50 nm-thickness and the Pt film 34 of a 75 nm-thickness are sequentially formed to form the lower electrode 36 of Pt/Ir/IrO$_2$ structure. The IrO$_2$ film of a 175 nm-thickness forms the upper electrode 46. The ferro-electric film 38 is formed between the lower electrode 36 and the upper electrode 48. The lower electrode 36, the ferro-electric film 38 and the upper electrode 46 constitute the capacitor 48. That is, in the capacitor shown in FIG. 7B the lower electrode 36 alone has Pt/Ir/IrO$_2$ structure, and the upper electrode 46 is formed of the IrO$_2$ film 40 alone. The process for fabricating the capacitor can be simple.

Thus, a structure, film thicknesses, etc. of the electrodes are suitably determined in consideration of a structure characteristic of the semiconductor device, intended electric characteristics, etc.

[A Second Embodiment]

Figure 8A:
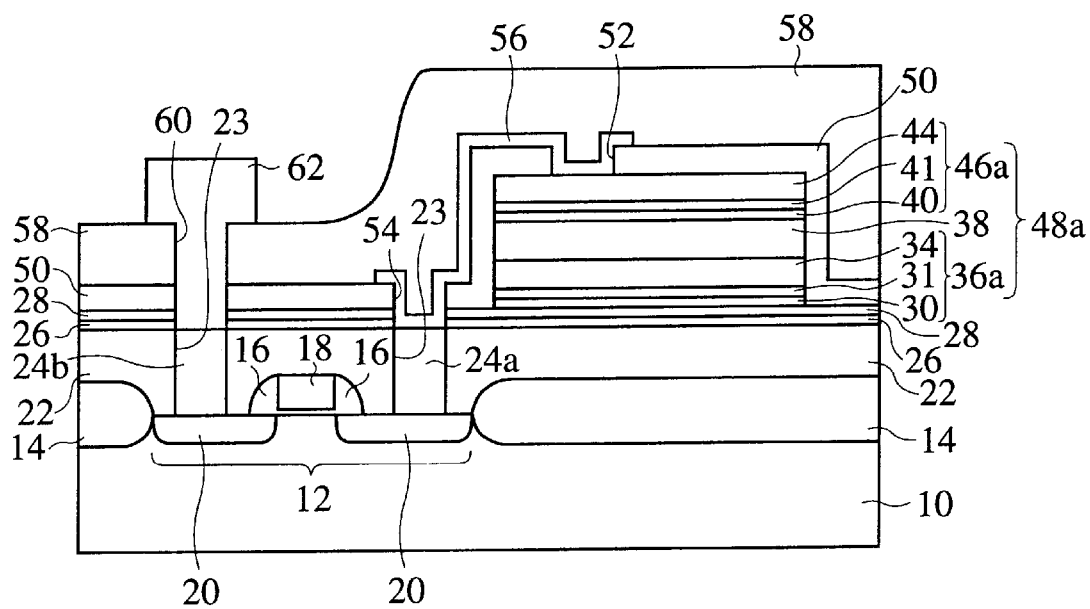
FIGS. 8A and 8B are sectional views of the semiconductor device according to a second embodiment of the present invention.
Figure 8B:
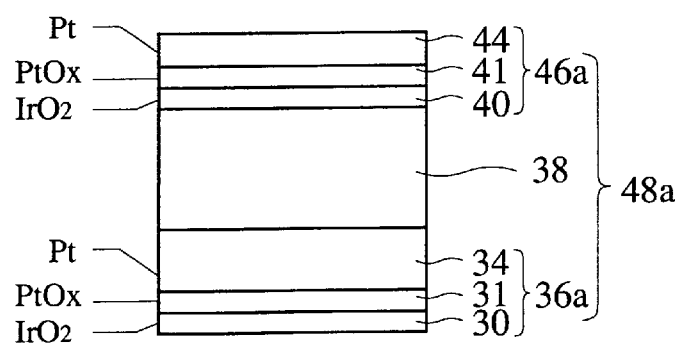
Figure 9A:
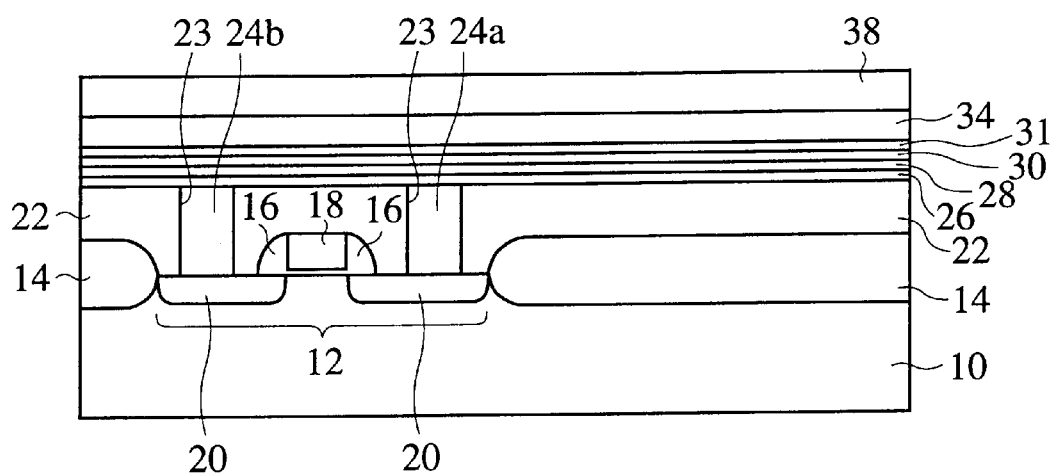
FIGS. 9A and 9B are sectional views of the semiconductor device according to the second embodiment in the steps of the process for fabricating the same, which show the process (Part 1).
Figure 10:
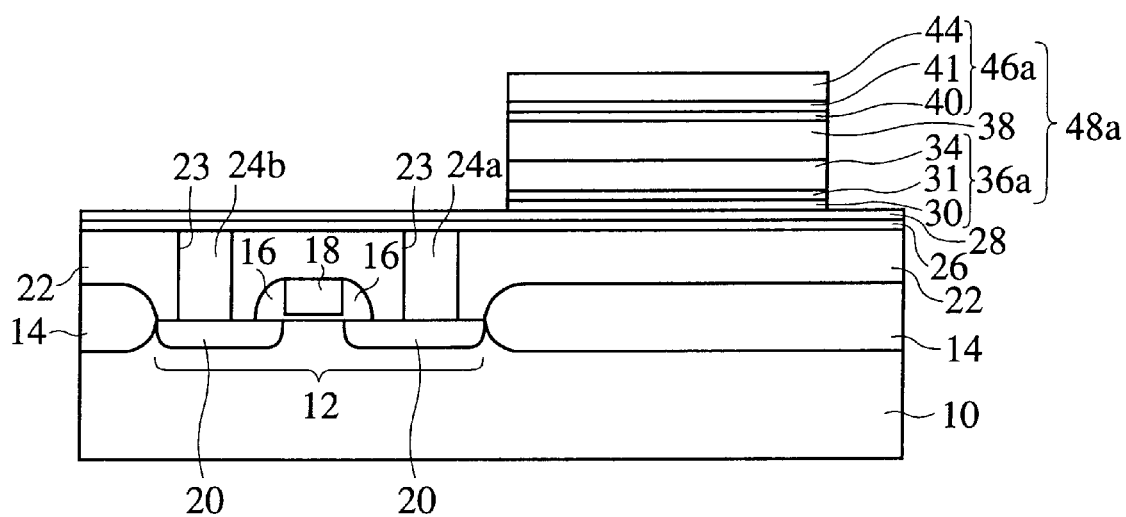
FIG. 10 is a sectional view of the semiconductor device according to the second embodiment in the steps of the process for fabricating the same, which show the process (Part 2).
Figure 11:
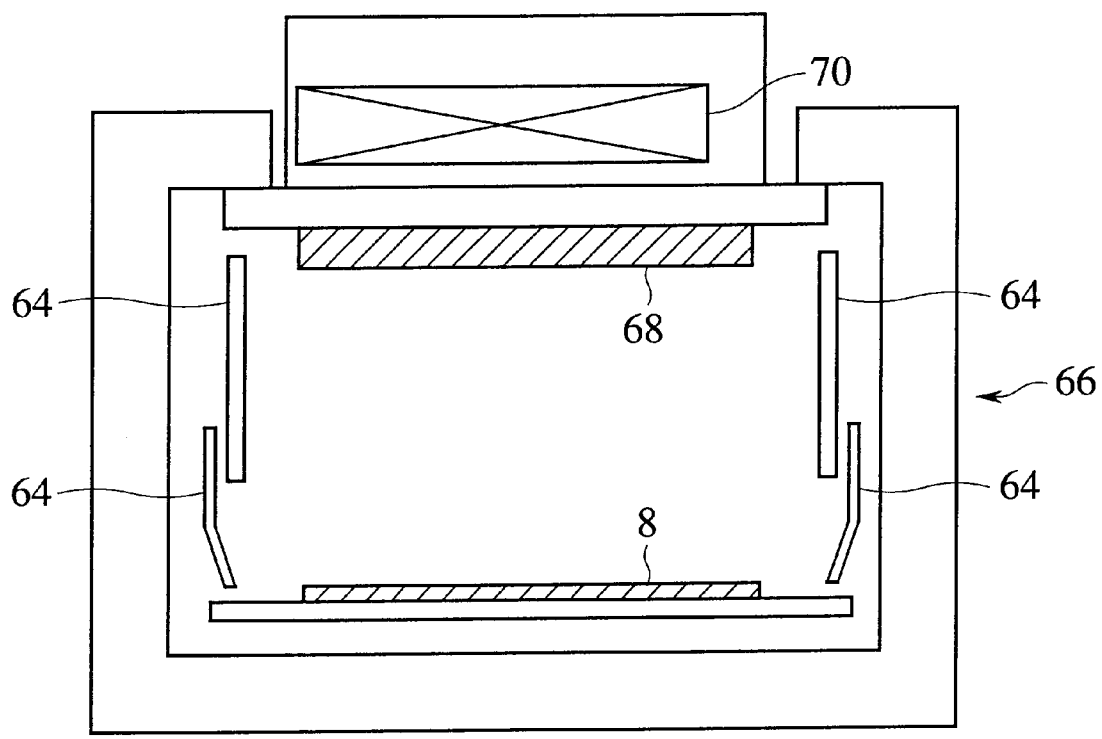
FIG. 11 is a schematic view of a chamber of a sputtering apparatus.

The semiconductor device according to a second embodiment of the present invention and the process for fabricating the same will be explained with reference to FIGS. 8A to 10. FIG. 8A is a sectional view of the semiconductor device according to the present embodiment, and FIG. 8B is a diagrammatic view of a structure of the capacitor. FIGS. 9A to 10 are sectional views of the semiconductor device according to the present embodiment in the steps of the process for fabricating the same, which show the process. FIG. 11 is a diagrammatic view of a chamber of the sputtering apparatus. The same members of the present embodiment as those of the semiconductor device according to the first embodiment shown in FIGS. 1 to 7B and the process for fabricating the same are represented by the same reference numbers not to repeat or to simplify their explanation.

(Semiconductor Device)

As shown in FIGS. 8A and 8B, on a silicon oxide film 28 there is formed a lower electrode 36a of Pt/PtO$_X$/IrO$_2$ structure which is formed by sequentially depositing a 50 nm-thickness IrO$_2$ film 30, a 50 nm-thickness PtO$_X$ film 31 and a 200 nm-thickness Pt film 34. A composition ratio X of oxygen in the PtO$_X$ film 31 may be suitably set within, e.g., a 0.1–2.0 range.

A ferro-electric film 38 is formed on the lower electrode 36a. The ferro-electric film 38 is formed of a 300 nm-thickness PbZrTiO$_3$ (PZT) film. A composition ratio of the PZT film forming the ferro-electric film 38 may be, e.g., Pb:Zr:Ti=110:52:48, but this composition ratio is not essential and may be suitably set.

An upper electrode 46a of Pt/PtO$_X$/IrO$_2$ structure is formed on the ferro-electric film 38. The upper electrode 46a is formed by sequentially depositing a 50 nm-thickness IrO$_2$ film 40, a 50 nm-thickness PtO$_X$ film 41 and a 200 nm-thickness Pt film 44. The lower electrode 36a, the ferro-electric film 38 and the upper electrode 46a constitute a capacitor 48a of a memory.

The semiconductor device according to the present embodiment is characterized mainly in that the lower electrode 36a and the upper electrode 46a include no Ir film.

That is, in the semiconductor device according to the first embodiment the lower electrode 36 and the upper electrode 46 include the Ir films 32, 42. The Ir films 32, 42 are formed by sputtering. In forming the Ir films 32, 42 on a semiconductor substrate 10, a sputtering apparatus having a chamber 66 shown in FIG. 11 is generally used. Ir sputtered from a target 68 deposits not only on the semiconductor substrate 10 but also on a deposition preventing plate 64. The Ir film deposited on the deposition preventing plate 64 often peels off the surface of the deposition preventing plate 64, and peeled Ir film sticks to the wafer 8 in particles. Particles of the Ir film thus sticking to the wafer 8 are a factor of low fabrication yields of the semiconductor device.

It will be because the Ir film easily peels off the deposition preventing plate 64 due to a high film stress about $1 \times 10^{11}$ dynes/cm$^2$ of the Ir film that particles tend to be formed in depositing the Ir film. A film stress of the IrO$_2$ film is about $5 \times 10^{10}$ dynes/cm$^2$, and that of the Ir film is about $1 \times 10^{11}$ dynes/cm$^2$, which is about twice that of the IrO$_2$ film.

In the present embodiment, a PtO$_X$ film having a low film stress in place of the Ir film is sandwiched between the Pt film and the IrO$_2$ film. The PtO$_X$ film, whose film stress is as low as $5 \times 10^9$ dynes/cm$^2$, does not easily peel off the deposition preventing plate 64. Thus, according to the present embodiment sticking of the particles to the wafer can be depressed, and the semiconductor device can have high fabrication yields.

(Process for Fabricating the Semiconductor Device)

Next, the process for fabricating the semiconductor device according to the present embodiment will be explained with reference to FIGS. 9A to 10.

The process for fabricating the semiconductor device according to the present embodiment follows the same steps up to the step of forming the silicon oxide film 28 are the process for fabricating the semiconductor device according to the first embodiment, and the explanation of the steps up to the silicon oxide film 28 forming step is omitted.

Following the silicon oxide film forming step, the 50 nm-thickness IrO$_2$ film 30 is formed on the entire surface in an O$_2$ atmosphere by reactive sputtering. Conditions for forming the film may be, e.g., Ir as a target, a 0.5–5 kW power, a 50–200 sccm O$_2$ flow rate and a substrate temperature at a range from room temperature to 500° C.

Then, the 50 nm-thickness PtO$_X$ film 31 is formed on the entire surface by reactive sputtering in an Ar and O$_2$ atmosphere. Condition for forming the film are, e.g., a Pt target, 50–200 kW power, a 50–200 sccm Ar flow rate, a 50–200 sccm O$_2$ flow rate and a substrate temperature at a range from room temperature to 200° C. An O$_2$/Ar gas ratio X for forming the PtO$_X$ film 31 may be suitably in a range of, e.g., 0.1–2.0.

Next, the 200 nm-thickness Pt film 34 is formed on the entire surface in an Ar atmosphere by sputtering under film forming conditions of, e.g., a Pt target, 0.5–5 kW power, a 50–200 sccm Ar flow rate and a substrate temperature at a range from room temperature to 500° C.

Next, the ferro-electric film 38 of an 300 nm-thickness PbZr$_x$Ti$_{1-x}$O$_3$ (PZT) film is formed on the entire surface by, e.g., sol-gel technique (see FIG. 9A). As a raw material for the sol-gel a product of, e.g., Mitsubishi Material may be used. Spin coating conditions may be 3000 rpm and 15 seconds. The drying is performed at 150° C. and for 10 minutes. Then, pre-annealing is performed by an electric furnace annealing apparatus in an oxygen atmosphere, at 400° C. and for 10 minutes. This step is repeated five times, and the 300 nm-thickness PZT film is formed. Next, the PZT film is annealed by RTA (Rapid Thermal Annealing). Annealing conditions may be an oxygen atmosphere, 700° C. and 1 minute.

Then, the 50 nm-thickness IrO$_2$ film 40 is formed on the entire surface in the same way as the IrO$_2$ film 30 is formed.

Next, the 50 nm-thickness PtO$_X$ film 41 is formed on the entire surface in the same way as the PtO$_X$ film 31 is formed.

Figure 9B:
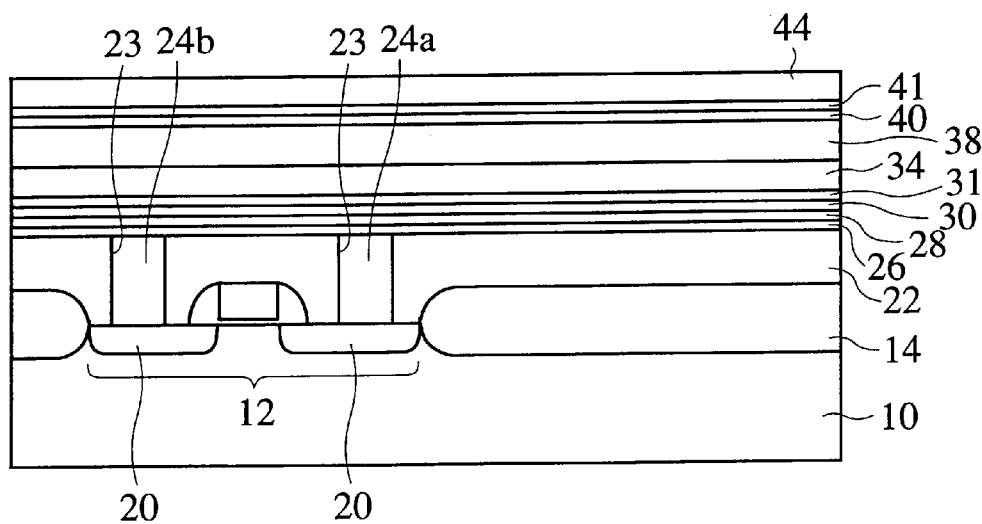

Then, the 200 nm-thickness Pt film 44 is formed on the entire surface in the same way as the Pt film 34 is formed (see FIG. 9B).

Next, the Pt film 44, the PtO$_X$ film 41, the IrO$_2$ film 40, the ferro-electric film 38, the Pt film 34, the PtO$_X$ film 31 and the IrO$_2$ film 30 are patterned by photolithography. The IrO$_2$ film 30, the PtO$_X$ film 31 and the Pt film 34 constitute the lower electrode 36a of Pt/PtO$_X$/IrO$_2$ structure. The IrO$_2$ film 40, the PtO$_X$ film 41 and the Pt film 44 constitute the upper electrode 46a of Pt/PtO$_X$/IrO$_2$ structure. The lower electrode 36a, the ferro-electric film 38 and the upper electrode 46a constitute the capacitor 48a (see FIG. 10). Dry etching may be used in the patterning. An etching condition may be, e.g., Cl$_2$ gas and Ar gas as etching gases.

The process for fabricating the semiconductor device according to the present embodiment is the same as that for fabricating the semiconductor according to the first embodiment, and although the process for fabricating the semiconductor device according to the present embodiment is not explained here, the semiconductor device according to the present embodiment is thus fabricated.

(Modification 1)

Figure 12A:
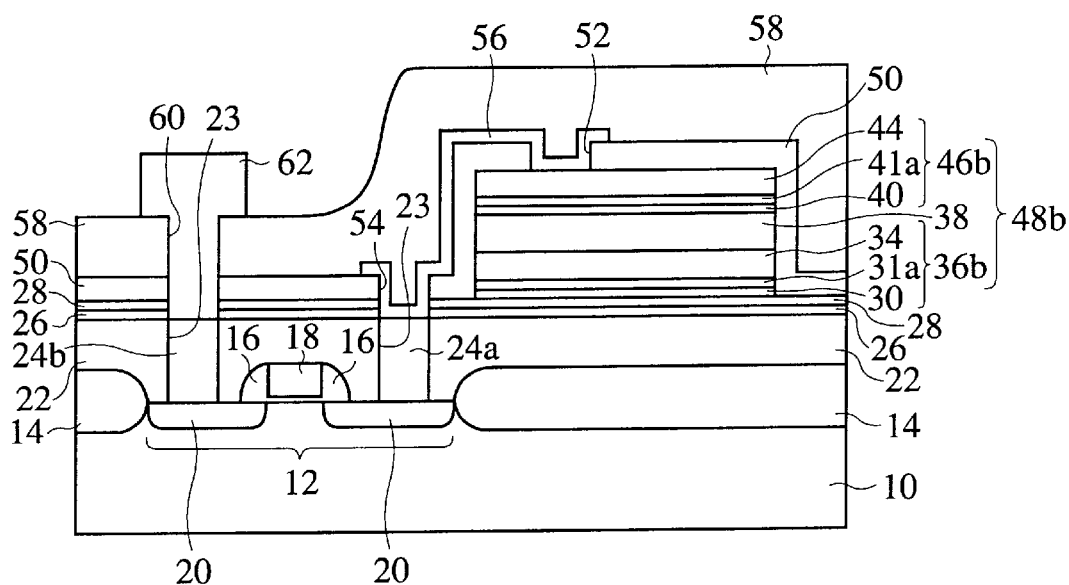
FIGS. 12A and 12B are sectional views of the semiconductor device according to a modification (Modification 1) of the second embodiment of the present invention.
Figure 12B:
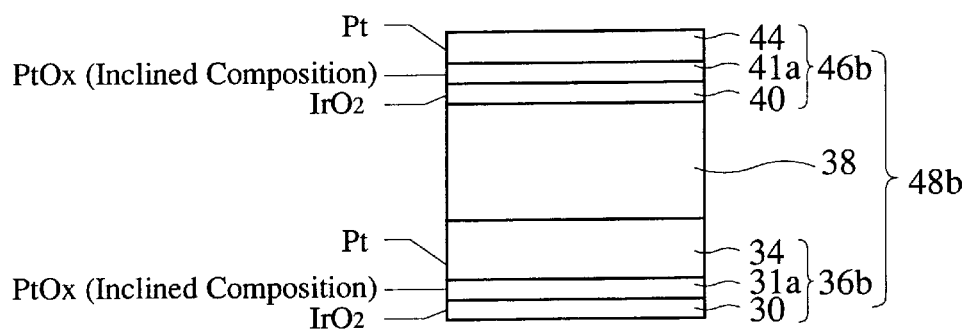
Figure 13A:
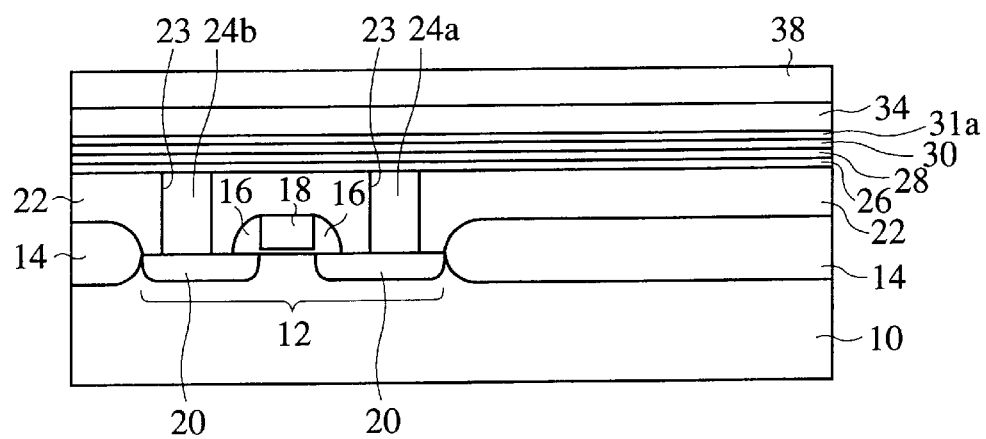
FIGS. 13A and 13B are sectional views of the semiconductor device according to the modification (Modification 1) of the second embodiment of the present invention in the steps of the process for fabricating the same, which show the process.
Figure 13B:
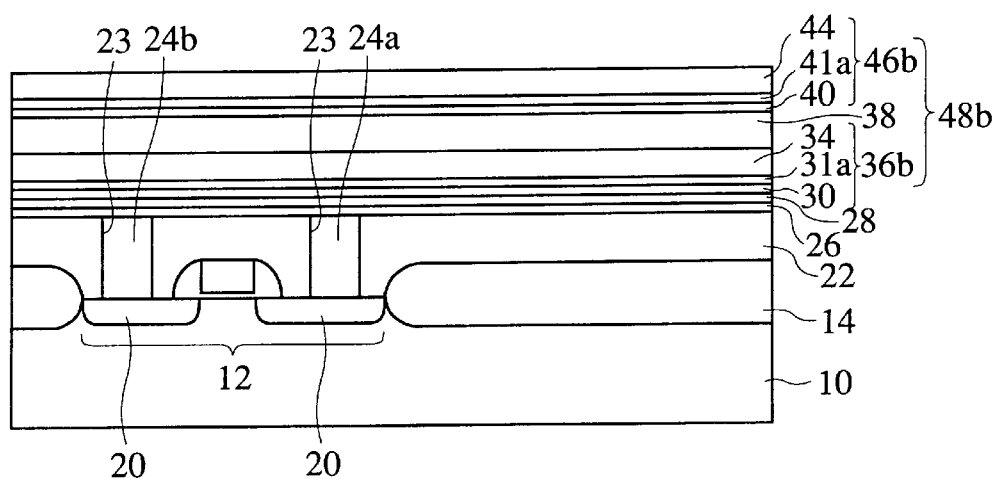
Figure 14:
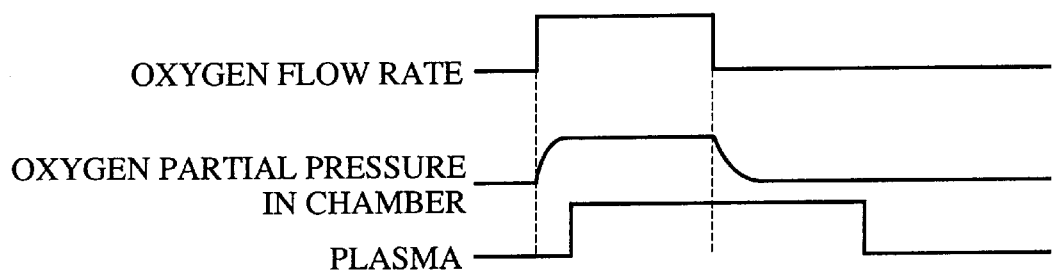
FIG. 14 is a time chart (Time Chart 1) for forming a $PtO_X$ film.

Next, Modification 1 of the semiconductor device according to the present embodiment and the process for fabricating the same will be explained with reference to FIGS. 12A to 14. FIG. 12A is a sectional view of the semiconductor device according to Modification 1. FIG. 12B is a diagrammatic view of the capacitor, which shows a structure thereof. FIG. 13A and 13B are views of the semiconductor device according to Modification 1 in the steps of the process for fabricating the same, which show the fabrication process. FIG. 14 is a time chart of forming the PtO$_X$ film by the process for fabricating the semiconductor device according to Modification 1.

The semiconductor device according to the present modification is characterized by an inclined composition in which composition ratios of oxygen in the PtO$_X$ films 31a, 41a gradually decrease away from the interfaces thereof with the respective IrO$_2$ films 30, 40. An O$_2$/Ar gas ratio X can be suitably changed in, e.g., a 0–2.0 range. In the present modification, because a composition ratio of oxygen in the PtO$_X$ films 31a, 41a gradually decreases away from the interface thereof with the respective IrO$_2$ films 30, 40, a difference between an oxygen composition between the PtO$_X$ film 31a and the Pt film 34 and an oxygen composition between the PtO$_X$ film 41a and the Pt film 44 is small. Thus, according to the present modification the lower electrode 36b and the upper electrode 46b can have good adhesion.

Next, the process for fabricating the semiconductor device according to the present modification will be explained with reference to FIGS. 13A and 13B.

The process for fabricating the semiconductor device according to the present modification follows the same steps up to the step of forming the IrO$_2$ film 30 as the process for fabricating the semiconductor device according to the second embodiment.

Following the IrO$_2$ film 30 forming step, the PtO$_X$ film 31a is formed. In the present modification, in the following way an oxygen composition ratio in the PtO$_X$ film 31a is decreased gradually away from the interface thereof with the IrO$_2$ film 30.

FIG. 14 is a time chart of a flow rate of oxygen fed into the chamber, a partial pressure of the oxygen in the chamber and power of a plasma in forming the PtO$_X$ film 31a.

In the present modification, the film deposition is set on by maintaining power of a plasma while an oxygen partial pressure decreases after the feed of oxygen into the chamber is stopped. Accordingly, while an oxygen partial pressure in the chamber decreases, an oxygen composition ratio in the PtO$_X$ film 31a continuously decreases. The PtO$_X$ film of an about 50 nm-thickness, which can be formed in tens seconds, is formed in accordance with the time chart shown in FIG. 14, whereby the PtO$_X$ film having a continuously changed oxygen composition can be formed by the simple step. Thus, according to the present modification, discontinuity of an oxygen composition in the interface between the PtO$_X$ film 30 and the Pt film 31a can be suppressed.

Then, the Pt film 34 and the ferro-electric film 38 are formed in the same way as in the second embodiment (see FIG. 13A).

Next, the 50 nm-thickness IrO$_2$ film 40 is formed on the entire surface in the same way as the IrO$_2$ film 30 is formed.

Then, the 50 nm-thickness PtO$_X$ film 41a is formed on the entire surface in the same way as the PtO$_X$ film 31a is formed.

Sequentially, the 200 nm-thickness Pt film 44 is formed on the entire surface in the same way as the Pt film 34 is formed (see FIG. 13B).

The process for fabricating the semiconductor device according to the present modification is the same as that according to the second embodiment down to the final step, and the explanation of the steps following the Pt film 44 forming step is omitted. Thus the semiconductor device according to the present modification is fabricated.

(Modification 2)

Figure 15:
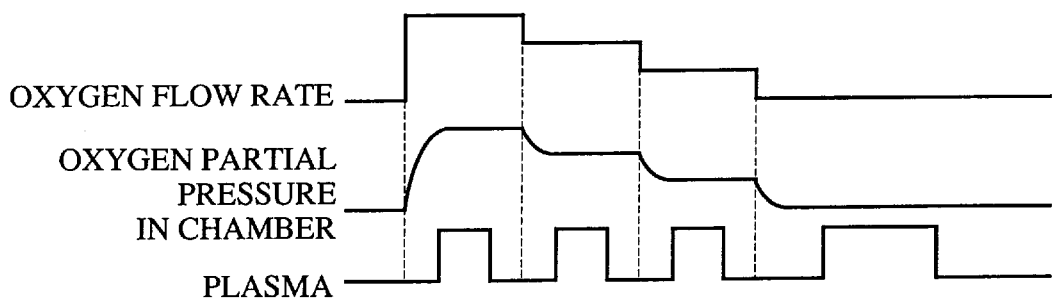
FIG. 15 is a time chart (Time Chart 2) for forming a $PtO_X$ film.

Next, Modification 2 of the semiconductor device according to the present embodiment and the process for fabrication the same will be explained with reference to FIG. 15. FIG. 15 is a time chart of forming the PtO$_X$ film by the semiconductor device fabrication process according to the present modification.

The semiconductor device according to the present modification and the process for fabricating the same are characterized mainly in that the PtO$_X$ films 31a, 41a are formed in accordance with the time chart shown in FIG. 15.

In the present modification, as shown in FIG. 15, the PtO$_X$ film of a prescribed film thickness is formed after a prescribed flow rate of oxygen is fed into the chamber, and the oxygen flow rate is stabilized in the chamber, a plasma is turned on. Next, the plasma power is turned off to pause the formation of the PtO$_X$ film.

Then, the flow rate of oxygen fed into the chamber is decreased to stabilize a partial oxygen pressure in the chamber, and then power of a plasma is turned on to further form the PtO$_X$ film. Then, the plasma power is turned off to pause the formation of the PtO$_X$ film.

Next, the oxygen flow rate is further decreased to stabilize an oxygen partial pressure in the chamber, and then power of a plasma is again turned on to form the PtO$_X$ film. Then, the plasma power is turned off to pause the formation of the PtO$_X$ film.

Next, the feed of oxygen into the chamber is stopped, and after no oxygen is present in the chamber, power of a plasma is again turned on to form the PtO$_X$ film having an oxygen composition ratio X of 0. Thus the PtO$_X$ films 31a, 41a having gradually decreased oxygen composition ratios are formed.

A PtO$_X$ film having an about 50 nm-thickness can be formed in tens seconds of formation, but in the present modification, a plasma is suitably turned off to decrease an oxygen concentration in the chamber, and then a plasma is turned on for a short period of time to form the film, where the PtO$_X$ film having bluntly changing oxygen composition ratios can be formed.

In the present modification the PtO$_X$ films 31a, 41a have an oxygen composition which decreases gradually away from the interfaces thereof with the IrO$_2$ films 30, 40, whereby the lower electrode 36b and the upper electrode 46b can have better adhesion.

(Modification 3)

Figure 16:
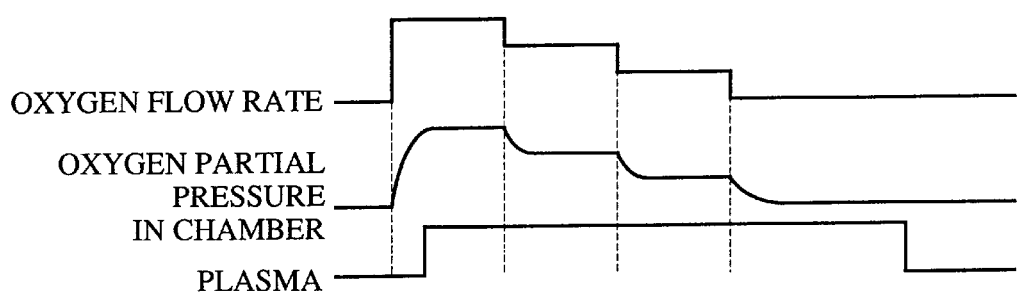
FIG. 16 is a time chart (Time Chart 3) for forming a $PtO_X$ film.

Then, the semiconductor device according to Modification 3 and the process for fabricating the same will be explained with reference to FIG. 16. FIG. 16 is a time chart of forming the PtO$_X$ film by the semiconductor device fabrication process according to the present modification.

The semiconductor device according to the present modification and the process for fabricating the same are characterized mainly in that the PtO$_X$ films 31a, 41a are formed in accordance with the time chart shown in FIG. 16.

In the present modification, after a prescribed flow rate of oxygen is fed into the chamber, and the oxygen flow rate is stabilized in the chamber, a plasma is turned on to start the formation of the PtO$_X$ film.

Then, with the plasma set on, the oxygen flow rate fed into the chamber is gradually decreased. Then, after the chamber is emptied of oxygen, the plasma power is turned off to finish the film formation. Thus, the PtO$_X$ film 31a and the PtO$_X$ film 41a having a gradually decreasing oxygen composition can be formed.

In the present modification the PtO$_X$ films 31a, 41a having a gradually decreasing oxygen composition can be formed by decreasing an oxygen flow rate with power of a plasma set on, whereby the semiconductor device can be fabricated by the simple process.

(Evaluation Result)

Then, results of an evaluation test on adhesion of the lower electrodes and the upper electrodes of the semiconductor devices according to the present embodiment will be explained.

In the evaluation test on adhesion of the lower electrode and of the upper electrode adhesion was evaluated by applying epoxy resin between the upper electrode and pull means, drying the epoxy resin at 150° C. for 1 hour, and the pull means was pulled upward to thereby pull the upper electrode through the epoxy resin. When the upper electrode was peeled off the epoxy resin at the interface thereof with the epoxy resin, the adhesion of the electrodes was judged good. The adhesion of the electrodes was judged defective when the peeling takes place at the interface of any of the films of the capacitor. The adhesion evaluation test was conducted on 50 pieces of samples, and a ratio of defective ones of the samples was computed.

The conventionally proposed semiconductor device, i.e., the semiconductor device having the lower and the upper electrodes of Pt/IrO$_2$ structure had a 80% defective adhesion ratio. The semiconductor device according to the first embodiment, i.e., the semiconductor device having the lower electrode and the upper electrode of Pt/Ir/IrO$_2$ structure had a 20% defective adhesion ratio.

In contrast to these results, the semiconductor device according to the present embodiment, i.e., the semiconductor device having the lower electrode and the upper electrode of Pt/PtO$_X$/IrO$_2$ structure had a 25% defective adhesion ratio. The semiconductor device according to the modifications of the present embodiment, i.e., the semiconductor device having the PtO$_X$ films 31a, 41a whose oxygen composition ratios respectively decreased gradually away from the IrO$_2$ films 30, 40 has a 0% defective adhesion ratio.

Thus, the semiconductor device according to the present embodiment can attain the low defective adhesion ratio, which is substantially equal to that of the semiconductor device according to the first embodiment. As described above, the present embodiment can form the lower electrode and the upper electrode having good adhesion.

Figure 17:
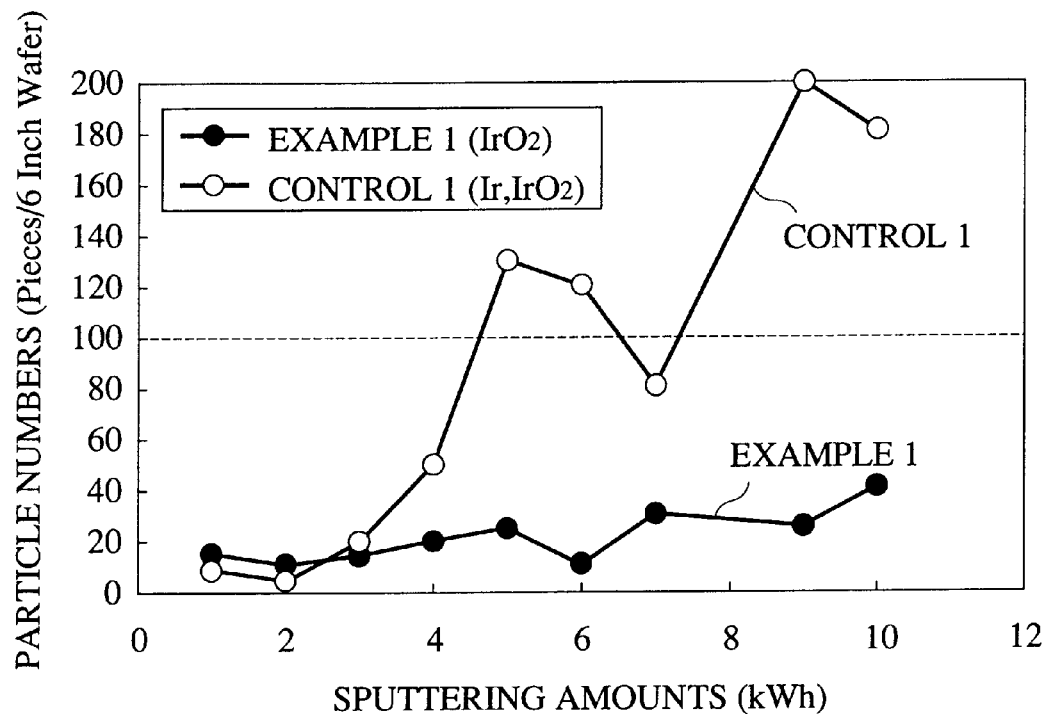
FIG. 17 is a graph of particle numbers for a case where an Ir film and an $IrO_2$ film are formed.
Figure 18:
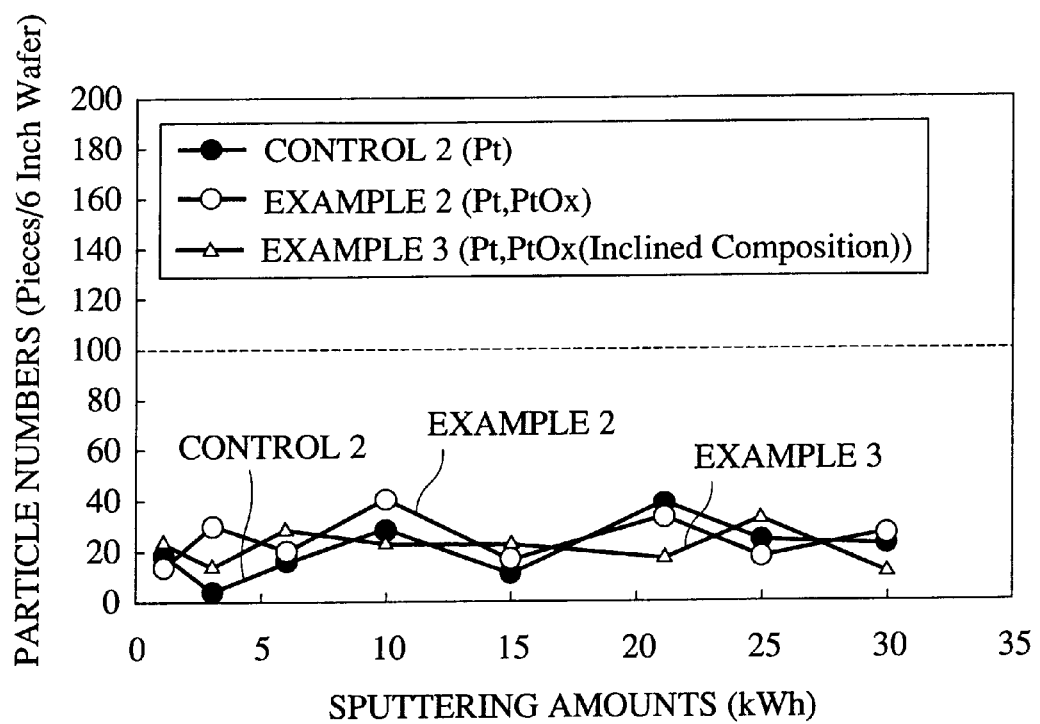
FIG. 18 is a graph of particle numbers for a case where a Pt film and a $PtO_X$ film are formed.

Then, results of an evaluation test on particle numbers will be explained with reference to FIGS. 17 and 18. FIG. 17 shows particle numbers generated when the Ir film and the IrO$_2$ films were formed. FIG. 18 is a graph of particle numbers generated when the Pt film and the PtO$_X$ film were formed. In FIGS. 17 and 18 sputtering amounts, i.e., products of sputtering electric power and sputtering times are taken on the horizontal axes, and numbers of particles sticking on wafers are taken on the vertical axes. Particle numbers were given by loading a wafer for a prescribed period of time of sputtering and computing increased numbers of particles sticking to the wafer. When a particle number was computed, particles of above 0.2 $\mu$m sizes were computed. As wafers 6-inch silicon wafers were used.

In FIG. 17, Control 1 indicates particle numbers for the case that the Ir film and the IrO$_2$ film were formed. In Example 1 particle numbers for the case that the IrO$_2$ film alone was formed.

As shown in FIG. 17, in Control 1 more than 100 particles sticked to the wafer at above 5 kWh sputtering amounts. In contrast to this, in Example 1 numbers of particles were depressed to be less than 100 pieces even at a 10 kWh sputtering amount.

In FIG. 18 Control 2 indicates particle numbers of the case that the Pt film alone was formed. Example 2 indicates particle numbers of the case that the Pt film and the PtO$_X$ film were formed. Example 3 indicates particle numbers of the case that the PtO$_X$ film had the inclined composition in which an oxygen composition ratio was gradually changed when the Pt film and the PtO$_X$ film were formed.

As shown in FIG. 18, in all of Control 2, Example 2 and Example 3 particle numbers were very small at a 30 kWh sputtering amount. Based on this result, it is considered that particles are not easily generated when the PtO$_X$ film and the Pt film are formed.

The process for fabricating the semiconductor device according to the present embodiment corresponds to forming the lower electrode and the upper electrode by combining Example 1 and Example 2 or Example 1 and Example 3, and either of the cases depresses the generation of particles.

As described above, according to the present embodiment, the lower electrode and the upper electrode are formed without using the Ir film, whereby numbers of particles sticking to the wafer can be small, and fabrication yields of the semiconductor device can be high.

[A Third Embodiment]

Figure 19A:
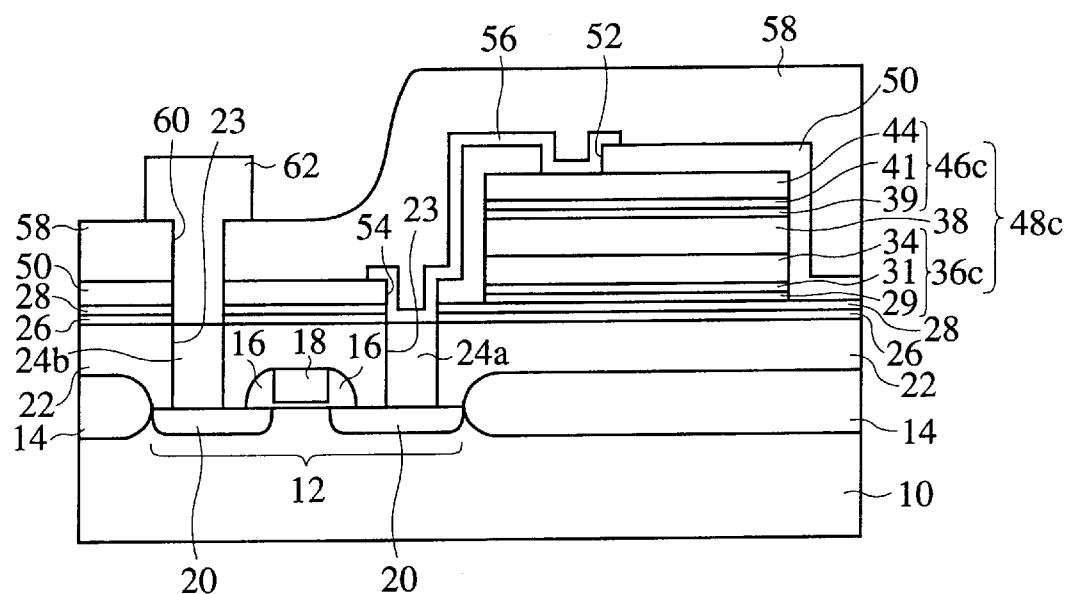
FIGS. 19A and 19B are sectional views of the semiconductor device according to a third embodiment of the present invention.
Figure 19B:
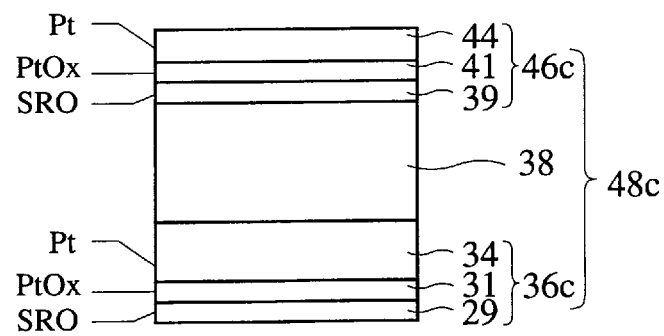
Figure 20A:
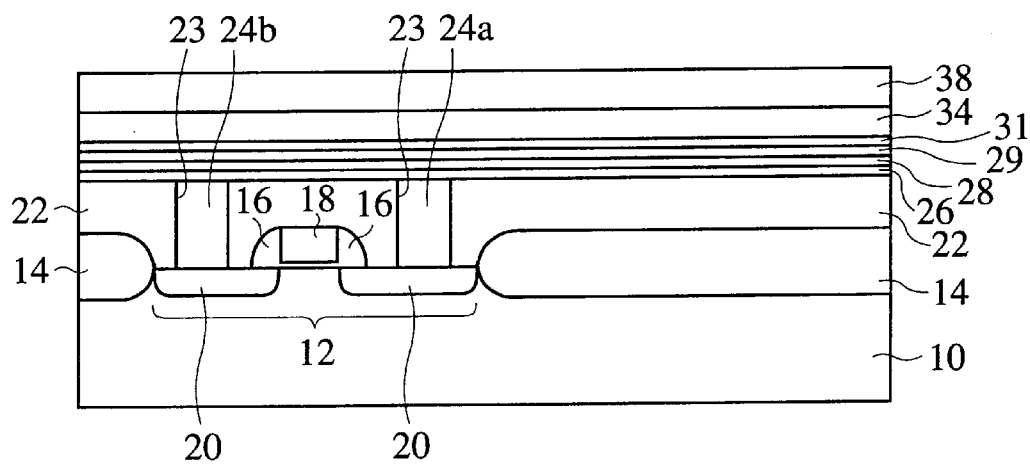
FIGS. 20A and 20B are sectional views of the semiconductor device according to the third embodiment of the present invention in the steps of the process for fabricating the same, which show the process (Part 1).

The semiconductor device according to a third embodiment of the present invention and the process for fabricating the same will be explained with reference to FIGS. 19A to 21. FIG. 19A is a sectional view of the semiconductor device according to the present embodiment. FIG. 19B is a diagrammatic view of the capacitor, which shows a structure thereof. FIGS. 20A to 21 are sectional views of the semiconductor device according to the present embodiment in the steps of the process for fabricating the same, which shows the process. The same members of the semiconductor device according to the first or the second embodiment shown in FIGS. 1 to 18 are represented by the same reference numbers not to repeat or to simplify their explanation.

(Semiconductor Device)

The semiconductor device according to the present embodiment will be explained with reference to FIGS. 19A and 19B. The semiconductor device according to the present embodiment is characterized in that the upper electrode and the lower electrode include SrRuO$_3$ (SRO) films.

As shown in FIGS. 19A and 19B, on a silicon oxide film 28 there is formed a lower electrode 36c of Pt/PtO$_X$/SRO structure of a 50 nm-thickness SRO film 29, a 50 nm-thickness PtO$_X$ film 31 and a 200 nm-thickness Pt film 34 which are sequentially deposited. An oxygen composition ratio X of the PtO$_X$ film 31 may be suitably set in, e.g., a 0.1–2.0 range.

On the lower electrode 36c, there is formed the same ferro-electric film 38 as that of the second embodiment, which is formed of a 300 nm-thickness PZT film.

On the ferro-electric film 38 there is formed an upper electrode 46c of Pt/PtO$_X$/SRO structure of a 50 nm-thickness SRO film 39, a 50 nm-thickness PtO$_X$ film 41 and a 200 nm-thickness Pt film 44 which are sequentially deposited. The lower electrode 36c, the ferro-electric film 38 and the upper electrode 46c constitute a capacitor 48c of a memory.

The semiconductor device according to the present embodiment is characterized mainly in that the lower electrode 36c and the upper electrode 46c include the SRO films. That is, because SrRu is easily reacts with water in air, it is difficult to form stable SrRu film. In a case that the semiconductor device according to the first embodiment SRO film is used in place of the IrO$_2$ films 30, 40, SrRu film must be formed on the SRO film. It is difficult for the above-mentioned reason to form such SrRu film, and it has been impossible to use SRO film in place of the IrO$_2$ films 30, 40. According to the present embodiment, however, the PtO$_X$ films 31, 41 are formed respectively on the SRO films 29, 39, whereby even in this case that the SRO films 29, 39 are used, the lower electrode 36c and the upper electrode 46c can have high adhesion.

As described above, according to the present embodiment, the PtO$_X$ film is sandwiched between the Pt film and the SRO film to thereby form the lower electrode and the upper electrode including the SRO films. As a result, the lower electrode and the upper electrode may include the SRO films, and can have high adhesion.

(Process for Fabricating the Semiconductor Device)

Then, the process for fabricating the semiconductor device according to the present embodiment will be explained with reference to FIGS. 20A to 21.

The process for fabricating the semiconductor device according to the present embodiment is the same up to the step of forming the silicon oxide film 28 as the process for fabricating the semiconductor device according to the first embodiment, and the explanation of the steps up to the silicon oxide film forming step is omitted.

Following the silicon oxide film forming step, the 50 nm-thickness SRO film 29 is formed on the entire surface by sputtering. Conditions for forming the film may be, e.g., 0.3–5 kW power, a 200–500 sccm Ar flow rate and a substrate temperature at a range from room temperature to 500° C. Then, the SRO film 29 is crystallized by oxygen annealing at 600° C. and for 30 minutes.

Then, the 50 nm-thickness $PtO_X$ film 31 and the 200 nm-thickness Pt film 34 are sequentially formed in the same way as in the second embodiment.

Next, the ferro-electric film 38 is formed of a 300 nm-thickness PZT film (see FIG. 20A).

Then, the 50 nm-thickness SRO film 39 on the entire surface in the same way as the SRO film 29 is formed.

Then, the 50 nm-thickness $PtO_X$ film 41 is formed on the entire surface in the same was as the $PtO_X$ film 31 is formed.

Figure 20B:
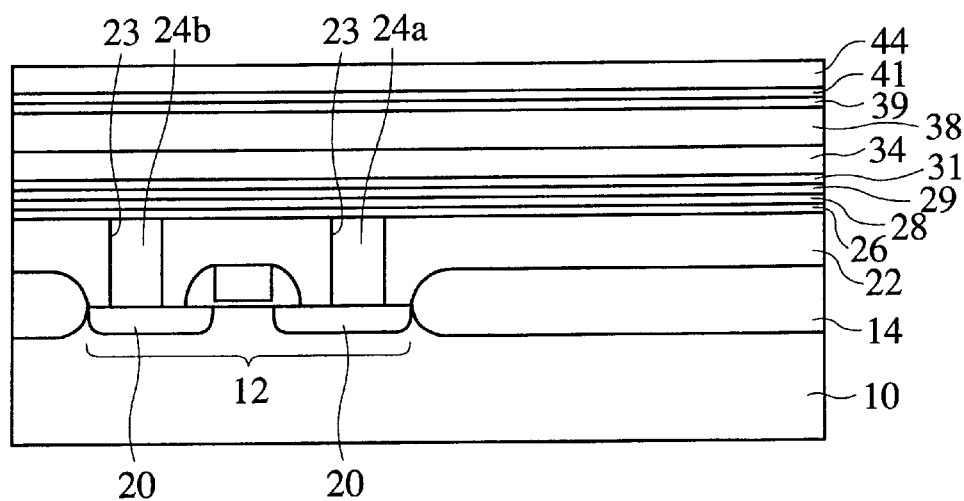
Figure 21:
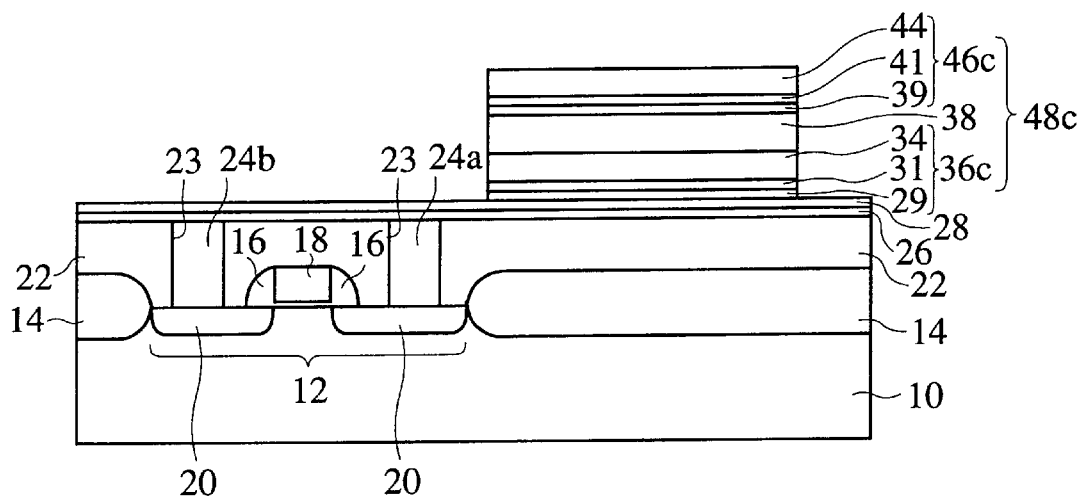
FIG. 21 is a sectional view of the semiconductor device according to the third embodiment of the present invention in the steps of the process for fabricating the same, which show the process (Part 2).

Next, the 200 nm-thickness Pt film 44 is formed on the entire surface in the same way as the Pt film 34 is formed (see FIG. 20B).

Then, in the same way as in the second embodiment, the Pt film 44, the $PtO_X$ film 41, the SRO film 39, the ferro-electric film 38, the Pt film 34, the $PtO_X$ film 31 and the SRO film 29 are patterned, and the lower electrode 36c of Pt/$PtO_X$/SRO structure and the upper electrode 46c of Pt/$PtO_X$/SRO structure are formed respectively of the SRO film 29, the $PtO_X$ film 31 and the Pt film 34 and of the SRO film 39, the $PtO_X$ film 41 and the Pt film 44. Thus, the lower electrode 36c, the ferro-electric film 38 and the upper electrode 46c constitute the capacitor 48c (see FIG. 21).

Figure 4A:
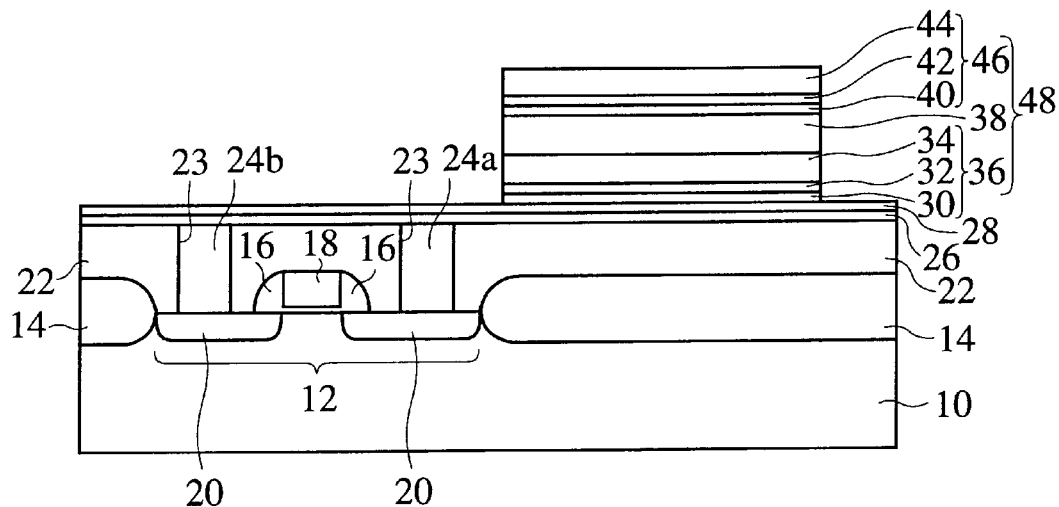
FIGS. 4A and 4B are sectional views of the semiconductor device according to the first embodiment in the steps of the process for fabricating the semiconductor device, which show the fabrication process (Part 3).
Figure 4B:
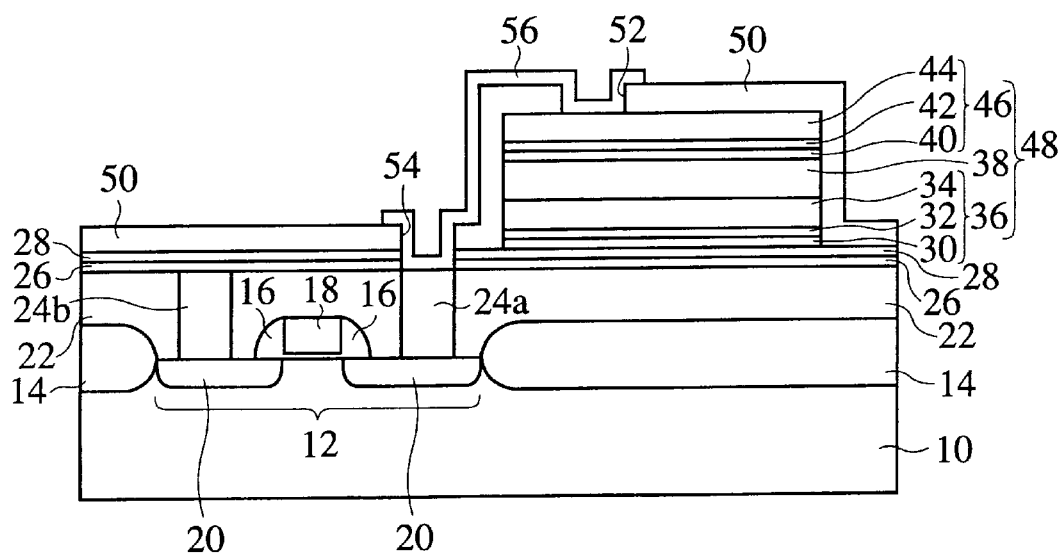
Figure 5:
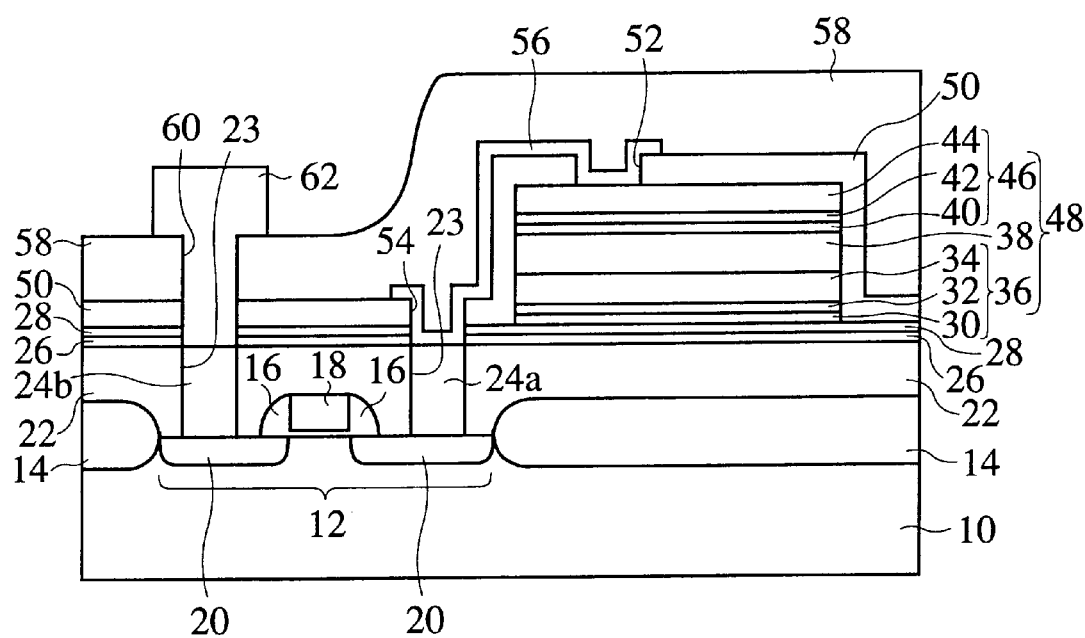
FIG. 5 is sectional views of the semiconductor device according to the first embodiment in the steps of the process for fabricating the semiconductor device, which show the fabrication process (Part 4).

In the steps following this step the process for fabricating the semiconductor device according to the present embodiment is the same as the process for fabricating the semiconductor device according to the first embodiment shown in FIGS. 4B and 5, and their explanation is omitted. Thus the semiconductor device according to the present embodiment is fabricated.

(Modification)

Figure 22A:
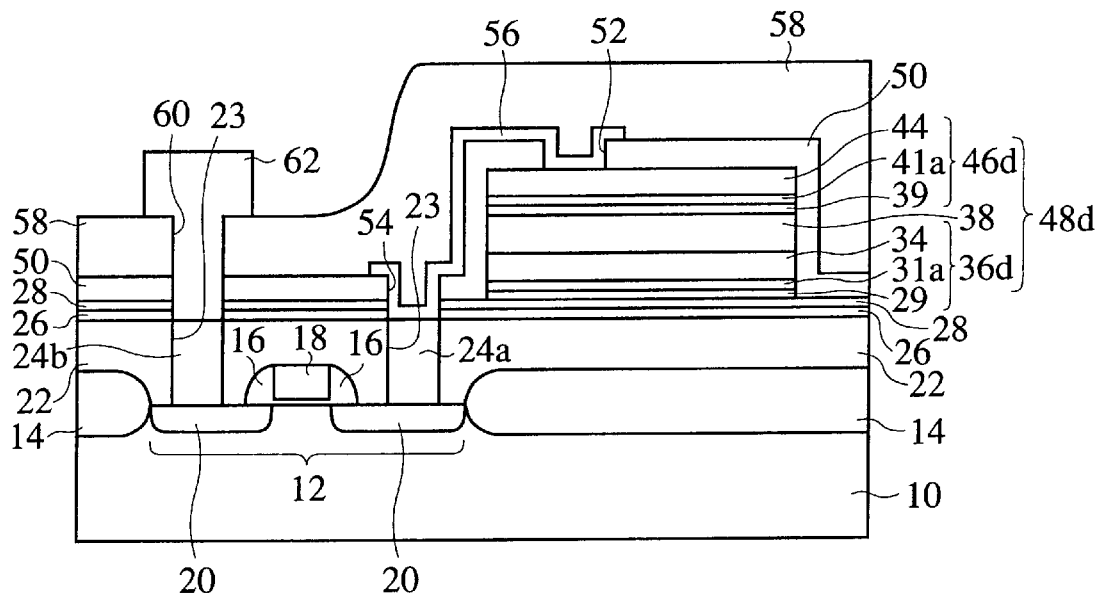
FIGS. 22A and 22B are sectional views of the semiconductor device according to a modification of the third embodiment of the present invention.
Figure 22B:
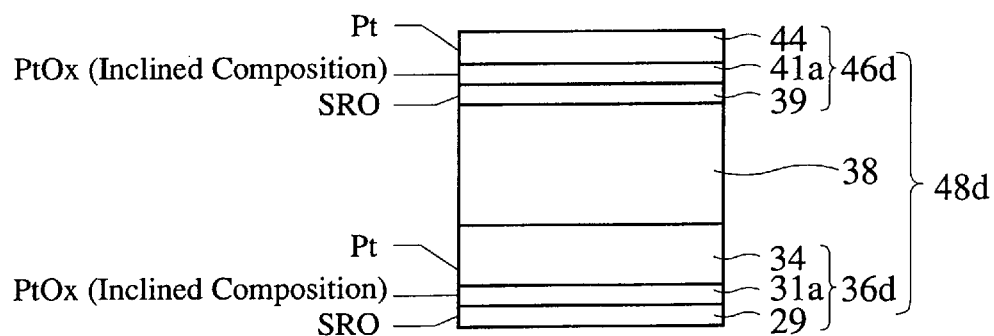

A modification of the semiconductor device according to the present embodiment and the process for fabricating the same will be explained with reference to FIGS. 22A and 22B. FIG. 22A is a sectional view of the semiconductor device according to the present modification. FIG. 22B is a diagrammatic view of the capacitor of the modification, which shows a structure thereof.

The semiconductor device according to the present modification is characterized in that the $PtO_X$ films 31a, 41a have inclined compositions of oxygen composition ratios which decrease gradually away from the interface thereof with the respective SRO films 29, 39. An $O_2$/Ar gas ratio X for forming the $PtO_X$ film may be suitably changed in, e.g., 0–2.0 range. According to the present modification, oxygen composition ratios X of the $PtO_X$ films 31a, 41a are decreased gradually away from the respective SRO films 29, 39, whereby a difference in oxygen composition between the $PtO_X$ film 31a and the Pt film 34 and a difference in oxygen composition between the $PtO_X$ film 41a and the Pt film 44 are small.

As described above, the lower electrode 36d and the upper electrode 46d can have good adhesion. The $PtO_X$ films 31a, 41a can be formed in the same way as in the process for fabricating the semiconductor device according to the modifications of the second embodiment.

(Results of Evaluation)

Then, results of an evaluation test on adhesion of the lower and the upper electrodes of the semiconductor device according to the present embodiment will be explained.

The evaluation test on adhesion of the lower and the upper electrodes was conducted in the same way as in the second embodiment.

The lower electrode and the upper electrode of Pt/SRO structure had a 90% defective adhesion ratio.

In contrast to this, the semiconductor device according to the present embodiment, i.e., the semiconductor device the lower and the upper electrodes of which have Pt/$PtO_X$/SRO structure had a 30% defective adhesion. The semiconductor device according to the modification of the present embodiment, i.e., the semiconductor device including the $PtO_X$ film 31a, 41a having oxygen composition ratios which decrease gradually away from the respective $IrO_2$ films 30, 40 had a 0% defective adhesion.

Thus, according to the present embodiment, the lower electrode and the upper electrode can have good adhesion.

Then, results of an evaluation test on particle numbers will be explained. In the case that the SrRu film was formed, a number of particles stuck, but a number of particles sticking to the wafer was depressed in the case that the SRO film was formed.

As described above, according to the present embodiment, numbers of particles sticking to wafers can be depressed, which can improve fabrication yields of the semiconductor device.

[A Fourth Embodiment]

Figure 23A:
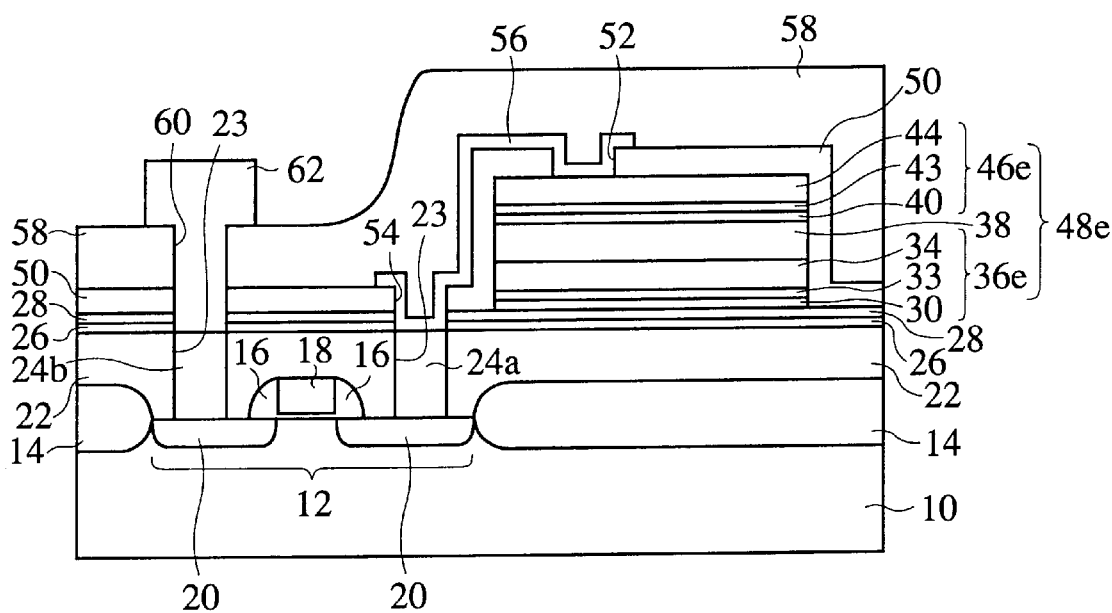
FIGS. 23A and 23B are sectional views of the semiconductor device according to a fourth embodiment of the present invention.
Figure 23B:
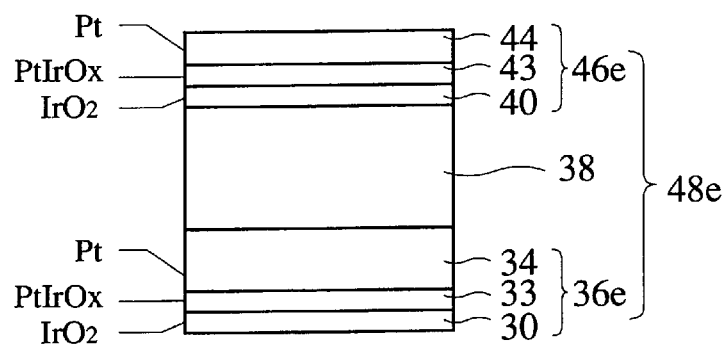
Figure 24A:
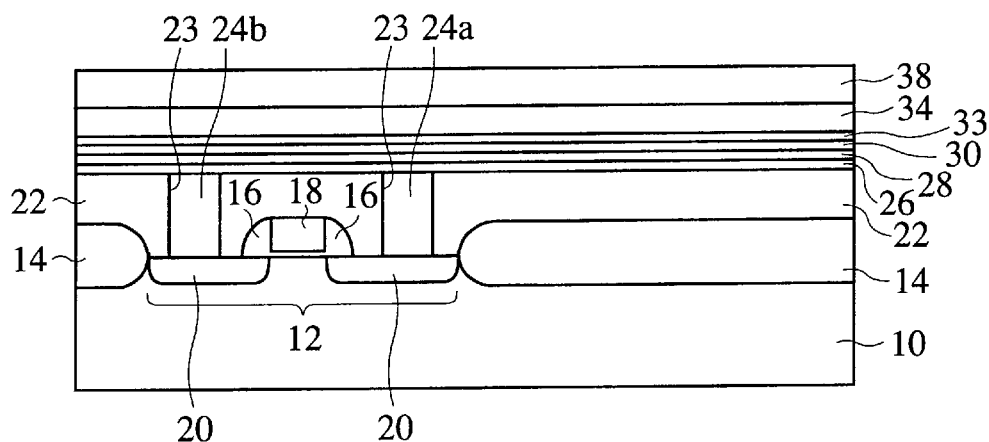
FIGS. 24A and 24B are sectional views of the semiconductor device according to the fourth embodiment of the present invention in the steps of the process for fabricating the same, which show the process (Part 1).

The semiconductor device according to a fourth embodiment of the present invention and the process for fabricating the same will be explained with reference to FIGS. 23A to 25. FIG. 23A is a sectional view of the semiconductor device according to the present embodiment. FIG. 23B is a diagrammatic view of the capacitor, which shows a structure thereof. FIGS. 24A to 25 are sectional views of the semiconductor device according to the present embodiment in the steps of the process for fabricating the same, which show the process. The same members of the present embodiment as those of the semiconductor device and the process for fabricating the same according to the first to the third embodiments are represented by the same reference numbers not to repeat or to simplify their explanation.

(Semiconductor Device)

First, the semiconductor device according to the present embodiment will be explained with reference to FIGS. 23A and 23B. The semiconductor device according to 'the present embodiment is characterized in that the electrodes each include a $PtIrO_X$ film, i.e., an alloy oxide film of Pt and Ir between a Pt film and an $IrO_X$ film.

As shown in FIG. 23A and 23B on a silicon oxide film 28 there is formed a lower electrode 36e of Pt/$PtIrO_X$/$IrO_2$ structure formed by sequentially depositing a 50 nm-thickness $IrO_2$ 30, a 50 nm-thickness $PtIrO_X$ film 33 and a 200 nm-thickness Pt film 34. An $O_2$/Ar gas ratio X for forming the $PtIrO_X$ film 33 may be suitably set in, e.g., 0.1–2.0 range.

On the lower electrode 36e there is formed a ferro-electric film 38 of a 300 nm-thickness PZT film which is formed in the same way as in the second embodiment.

On the ferro-electric film 38, there is formed an upper electrode of Pt/$PtIrO_X$/$IrO_2$ structure which is formed by sequentially depositing a 50 nm-thickness $IrO_2$ film 40, a 50 nm-thickness $PtIrO_X$ film 43 and a 200 nm-thickness Pt film 44. The lower electrode 36e, the ferro-electric film 38 and the upper electrode 46e constitute a capacitor 48e of a memory.

As described above, according to the present embodiment, the lower and the upper electrodes of the capacitor can be formed even of Pt/$PtIrO_X$/$IrO_2$ structure, i.e., an alloy oxide of Pt and Ir sandwiched between the Pt film and the $IrO_2$ film.

(Process for Fabricating the Semiconductor Device)

Then, the process for fabricating the semiconductor device according to the present embodiment will be explained with reference to FIGS. 24A to 25.

The process for fabricating the semiconductor device according to the present embodiment is the same up to the process for forming a silicon oxide film 28 as the process for fabricating the semiconductor device according to the first embodiment shown in FIGS. 2A to 2C, and the explanation of the steps up to the silicon oxide film forming step is omitted.

Following the silicon oxide film forming step, the 500 nm-thickness $Ir_2$ film 30 is formed.

Next, the 500 nm-thickness $PtIrO_X$ film 33 is formed on the entire surface by reactive sputtering an Ar and $O_2$ atmosphere. Conditions for forming the film may be, e.g., a target having a 0.1–0.5 Ir/Pt ratio, 0.5–5 kW power, a 200–500 sccm Ar flow rate, a 200–500 sccm $O_2$ flow rate and a substrate temperature at a range from room temperature to 500° C. An $O_2$/Ar gas ratio X for forming the $PtO_X$ film 31 may be suitably set in, e.g., a 0.1–2.0 range.

Then, in the same way as in the second embodiment, the 200 nm-thickness Pt film 34 and the 300 nm-thickness PZT film are sequentially formed to form the ferro-electric film 38 (see FIG. 24A).

Next, the 50 nm-thickness SRO film 39 is formed on the entire surface in the same way as the $IrO_2$ film 30 is formed.

Next, the 50 nm-thickness $PtIrO_X$ film 43 is formed on the entire surface in the same way as the $PtIrO_X$ film 33.

Figure 24B:
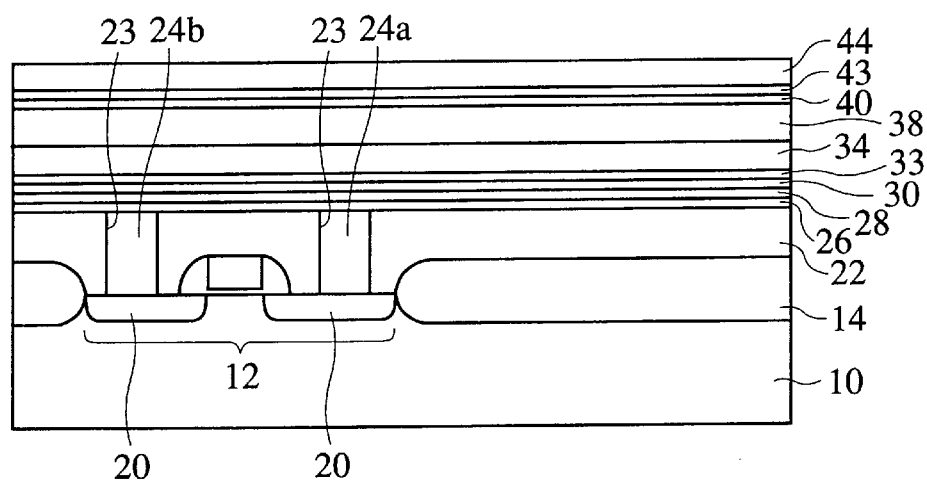
Figure 25:
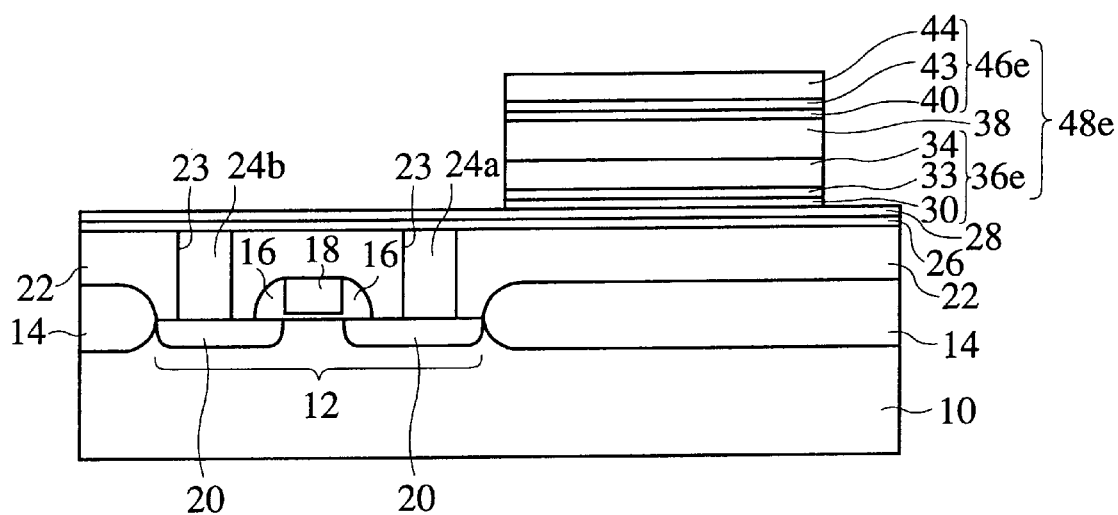
FIG. 25 is sectional views of the semiconductor device according to the fourth embodiment of the present invention in the steps of the process for fabricating the same, which show the process (Part 2).

Then, the 200 nm-thickness Pt film 44 is formed on the entire surface in the same way as the Pt film 34 (see FIG. 24B).

Then, in the same way as in the second embodiment, the Pt film 44, the $PtIrO_X$ film 43, the $IrO_2$ film 40, the ferro-electric film 38, the Pt film 34, the $PtIrO_X$ film 33 and the $IrO_2$ film 30 are patterned. Thus, the lower electrode 36e of $Pt/PtIrO_X/IrO_2$ structure of the $IrO_2$ film 30, the $PtIrO_X$ film 33 and the Pt film 34 is formed, and the upper electrode 46e of $Pt/PtIrO_X/IrO_2$ structure of the $IrO_2$ film 40, the $PtIrO_X$ film 43 and the Pt film 44 is formed. The lower electrode 36e, the ferro-electric film 38 and the upper electrode 46e constitute the capacitor 48e (see FIG. 25).

The following steps of the process for fabricating the semiconductor device according to the present embodiment are the same as those of the process for fabricating the semiconductor device according to the first embodiment shown in FIGS. 4B and 5, and the explanation of the steps is omitted. Thus the semiconductor device according to the present embodiment is fabricated.

(Modification)

Figure 26A:
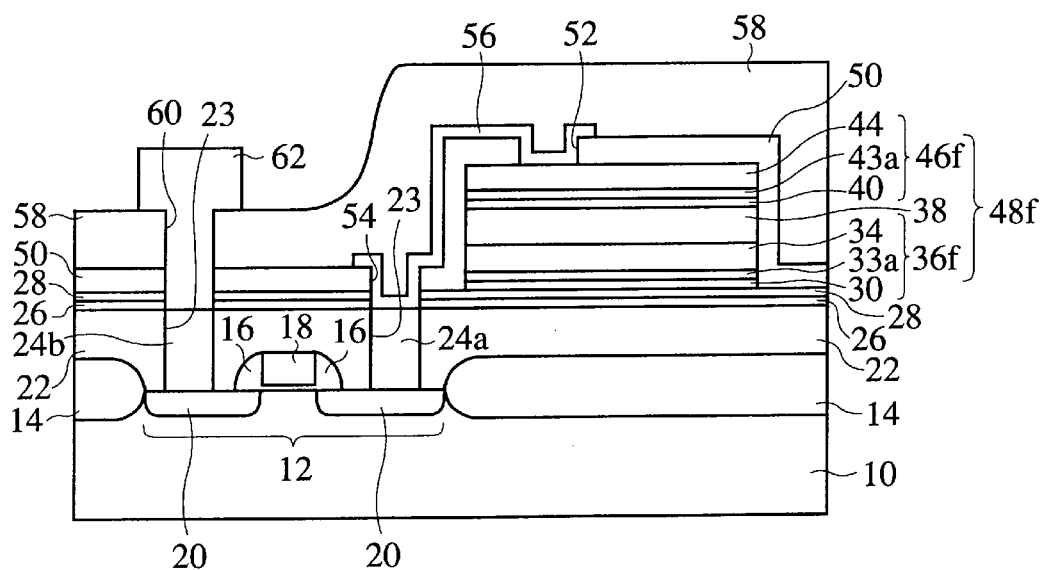
FIGS. 26A and 26B are sectional views of the semiconductor device according to a modification of the fourth embodiment of the present invention.
Figure 26B:
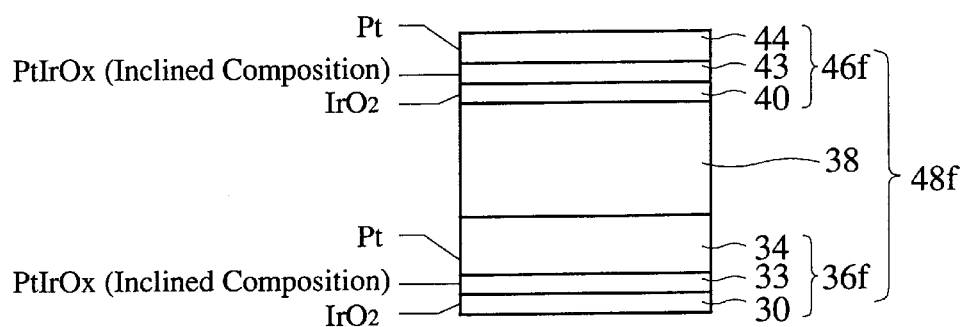

Then a modification of the semiconductor device according to the present embodiment and the process for fabricating the same will be explained with reference to FIGS. 26A and 26B. FIG. 26A is a sectional view of the semiconductor device according to the modification. FIG. 26B is a diagrammatic view of the capacitor, which shows a structure thereof.

The semiconductor device according to the modification is characterized in that the $PtIrO_X$ films 33a, 43a have inclined composition in which oxygen composition ratios of the $PtIrO_X$ films 33a, 43a decrease gradually away from the respective interfaces with the $IrO_2$ films 30, 40. An $O_2$/Ar gas ratio X for forming the $PtIrO_X$ film may be suitably changed in, e.g., a 0–2.0 range. In the present modification, an oxygen composition ratio X of the $PtIrO_X$ films 33a, 43a decreases gradually away from the respective $IrO_2$ films 30, 40, whereby a difference in oxygen composition between $PtIrO_X$ film 33a and the Pt film 34 and a difference in oxygen composition between the $PtIrO_X$ film 43a and the Pt film 44 are small.

As described above, according to the present embodiment the lower electrode 36f and the upper electrode 46f can have good adhesion. The $PtIrO_X$ films 33a, 43a having such inclined composition can be formed in the same way as in the process for fabricating the semiconductor device according to the modifications of the second embodiment.

(Evaluation Results)

Then, results of an evaluation test on adhesion of the lower electrode and the upper electrode of the semiconductor device according to the present embodiment fabricated by the process for fabricating the same will be explained.

The evaluation test of adhesion of the lower electrode and the upper electrode was conducted in the same way as in the second embodiment.

The lower electrode and the upper electrode of $Pt/IrO_2$ structure had a 80% defective adhesion ratio.

In contrast to this, the lower electrode and the upper electrode of the semiconductor device according to the present embodiment, i.e., having $Pt/PtIrO_X/IrO_2$ structure had a 20% defective adhesion ratio. The lower electrode and the upper electrode of the semiconductor device according to the modification of the present embodiment, which, i.e., include the $PtIrO_X$ films 33a, 43a having oxygen composition ratios decreasing gradually away from the respective $IrO_2$ films 30, 40, had a 0% defective adhesion ratio.

As described above, the lower electrode and the upper electrode had good adhesion.

Then, results of a particle evaluation test on particle numbers will be explained. In the case that the electrodes included the Ir films, a number of particles stuck to the wafer, but a number of particles sticking to the wafer was depressed in the case that the electrodes included the $PtIrO_X$ films.

As described above, according to the present embodiment, numbers of particles sticking to the wafers can be depressed, and the semiconductor device can have improved fabrication yields.

(Modified Embodiment)

The present invention is not limited to the above-described embodiments and covers other various modifications.

The first to the fourth embodiments are applied to, e.g., FeRAMs but are not limited to FeRAMs, and are applicable to any semiconductor device using Pt in the electrodes. The first to the fourth embodiments are applicable to, e.g., semiconductor devices, etc. using oxide films as the dielectrics of the capacitors, more specifically to DRAMs using high dielectric films $(Ba, Sr)TiO_3$.

In the first to the fourth embodiments Pt film is used in the electrodes, but an alloy film containing Pt may be used in the electrodes in place to Pt film.

In the first embodiment the electrodes have $Pt/Ir/IrO_2$ structure, but may have, e.g., $Pt/Ir/IrO_2/Ir$ structure for higher adhesion of the $IrO_2$ film with respect to the substrate.

In the first embodiment the electrodes have $Pt/Ir/IrO_2$ structure but are not limited to the $Pt/Ir/IrO_2$ structure. The electrodes may have, e.g., $Pt/Ru/RuO_2$ structure or $Pt/Rh/RhO_2$ structure or others.

In the first embodiment, three independent films, the Pt film, the Ir film and $IrO_2$ film are deposited to form the upper and the lower electrodes, but it is not essential to deposit three independent films to form the electrodes. The electrodes may be formed by, e.g., continuously changing compositions of the films. Specifically, it is possible that the $IrO_2$ film is formed, then feed of $O_2$ into the deposition chamber is stopped to form the Ir film, and then a composition of Pt is increased to for an alloy film of Pt and Ir.

In the first to the fourth embodiments the ferro-electric film is provided by a $PbZr_xTi_{1-x}O_3$ (PZT) film but is not limited to a $PbZr_xTi_{1-x}O_3$ (PZT) film. The ferro-electric film may be provided any ferro-electric film, e.g., a La-doped $PbZr_xTi_{1-x}O_3$ (PZT) film, $SrBi_2Ta_2O_9$ (SBT) film, $SrBi_2(Ta, Nb)_2O_9$ film, Y1 group film, or others.

In the second embodiment, $Pt/PtO_x/IrO_2$ structure is applied to both the upper and the lower electrodes of the capacitor but is not essentially applied to both the upper and the lower electrodes. The $Pt/PtO_x/IrO_2$ structure may be applied to, e.g., only either of the electrodes whose Pt film tends to peel off.

In the second embodiment, the $IrO_2$ film is 50 nm, the $PtO_x$ film is 50 nm, and the Pt film is 200 nm, but they are not essentially limited to the stated thicknesses. Their thicknesses may be suitably set. For example, the $PtO_x$ film may have a 20–200 nm thickness.

In the second and the fourth embodiments the $IrO_2$ film 30 and the $IrO_2$ film 40 are formed but are not essential. For example, oxide films of Ir, Ru or Rh, or an alloy oxide film containing Ir, Ru or Rh may be used.

In the second and the third embodiments the $PtO_x$ films 31, 41 are formed but are not essential. For example, oxide films of Ir, Ru or Rh, or an alloy oxide film containing Pt, Ir, Ru or Rh may be used.

In the second to the fourth embodiments the Pt films 33, 44 are formed but are not essential. For example, oxide films of Ir, Ru or Rh, or an alloy oxide film containing Pt, Ir, Ru or Rh may be used.

In the second embodiment, the lower electrode and the upper electrode have $Pt/PtO_x/IrO_2$ structure, but the lower electrode and the upper electrode may have $Pt/PtO_x/Ir/IrO_2$ structure having an Ir film sandwiched between a $PtO_x$ film and an $IrO_2$ film. The lower electrode and the upper electrode of such structure can have good adhesion.

In the third embodiment, $Pt/PtO_x/SRO$ structure is applied to both the lower electrode and the upper electrode of the capacitor but is not essentially applied to both the lower and the upper electrodes. The $Pt/PtO_x/SRO$ structure may be applied to only either of the lower and the upper electrodes the Pt film of which tends to peel off.

In the third embodiment, the SRO film is 50 nm, the $PtO_x$ film is 50 nm, and the Pt film is 200 nm. These thicknesses are not essential and may be suitably set. For example, the $PtO_x$ film may have a 20–200 nm thickness.

In the third embodiment, the SRO film 29 and the SRO film 39 are formed but are not essential. For example, an alloy oxide film containing SrRu may be used.

In the fourth embodiment, $Pt/PtIrO_x/IrO_2$ structure is applied to both the lower and the upper electrodes but is not essentially applied to both the lower and the upper electrodes. The $Pt/PtIrO_x/IrO_2$ structure may be applied to only either of the lower and upper electrodes the Pt film of which tends to peel off.

In the fourth embodiment, the $IrO_2$ film is 50 nm, the $PtIrO_x$ film is 50 nm, and the Pt film is 200 nm. These thicknesses are not essential and may be suitably set. For example, the $PtIrO_x$ film may have a 20–200 nm thickness.

In the fourth embodiment, the $PtIrO_x$ film 33 and the $PtIrO_x$ film 43 are formed but are not essential. For example, an alloy oxide film containing Pt, Ir, Ru or Rh may be formed.

What is claimed is:

1. A semiconductor device comprising:

an electrode which includes a first conductive film formed on a substrate and formed of an oxide film of a first noble metal, a second conductive film formed on the first conductive film and formed of the first noble metal, and a third conductive film formed on the second conductive film and containing a second noble metal different from the first noble metal.

2. A semiconductor device according to claim 1, wherein the electrode further includes a fourth conductive film formed below the first conductive film and formed of the first noble metal.

3. A semiconductor device according to claim 2, wherein the third conductive film further contains the first noble metal.

4. A semiconductor device according to claim 1, wherein the third conductive film further contains the first metal.

5. A semiconductor device according to claim 3, wherein the third conductive film has a composition ratio of the first noble metal which decreases gradually away from the interface thereof with the second conductive film.

6. A semiconductor device according to claim 1, wherein the first noble metal is Ir, Ru or Rh.

7. A semiconductor device according to claim 1, wherein the second noble metal is Pt.

8. A semiconductor device comprising:

a capacitor including a lower electrode, a dielectric film formed on the lower electrode and an upper electrode formed on the dielectric film, the lower electrode and/or the upper electrode including a first conductive film formed on the substrate and formed of an oxide film of a first noble metal, a second conductive film formed on the first conductive film and formed of the first noble metal, and a third conductive film formed on the second conductive film and containing a second noble metal different from the first noble metal.

9. A semiconductor device according to claim 8, wherein the lower electrode and/or the upper electrode further includes a fourth conductive film formed below the first conductive film and formed of the first noble metal.

10. A semiconductor device accord to claim 9, wherein the third conductive film further contains the first noble metal.

11. A semiconductor device according to claim 8, wherein the third conductor film further contains the first noble metal.

12. A semiconductor device according to claim 11, wherein the third conductive film has a composition ratio of the first noble metal which decreases gradually away from the interface thereof with the second conductive film.

13. A semiconductor device according to claim 8, wherein the first noble metal is Ir, Ru or Rh.

14. A semiconductor device according to claim 8, wherein the second noble metal is Pt.

* * * * *